United States Patent
Higashijima et al.

(10) Patent No.: US 9,048,269 B2
(45) Date of Patent: Jun. 2, 2015

(54) SUBSTRATE LIQUID TREATMENT APPARATUS WITH LIFT PIN PLATE

(75) Inventors: Jiro Higashijima, Koshi (JP); Nobuhiro Ogata, Koshi (JP); Satoshi Kaneko, Koshi (JP); Shuichi Nagamine, Koshi (JP); Yoshihiro Kai, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 461 days.

(21) Appl. No.: 13/337,533

(22) Filed: Dec. 27, 2011

(65) Prior Publication Data

US 2012/0160278 A1 Jun. 28, 2012

(30) Foreign Application Priority Data

Dec. 28, 2010 (JP) ................................. 2010-293775
Nov. 1, 2011 (JP) ................................. 2011-240325

(51) Int. Cl.
*H01L 21/67* (2006.01)
*H01L 21/687* (2006.01)

(52) U.S. Cl.
CPC ...... *H01L 21/6708* (2013.01); *H01L 21/67051* (2013.01); *H01L 21/68728* (2013.01)

(58) Field of Classification Search
CPC ..................... H01L 21/67051; H01L 21/6708; H01L 21/68728
USPC ........................................................ 134/157
See application file for complete search history.

(56) References Cited

U.S. PATENT DOCUMENTS

| | | | |
|---|---|---|---|
| 5,927,305 A * | 7/1999 | Shiba ............................ | 134/153 |
| 6,398,975 B1 | 6/2002 | Mertens et al. | |
| 6,827,814 B2 * | 12/2004 | Taniyama et al. ......... | 156/345.12 |
| 8,607,807 B2 * | 12/2013 | Higashijima et al. ...... | 134/102.1 |
| 2001/0023166 A1 * | 9/2001 | Huynh et al. .................. | 451/73 |
| 2004/0231794 A1 | 11/2004 | Hongo et al. | |
| 2007/0275562 A1 * | 11/2007 | Kim et al. ..................... | 438/704 |
| 2007/0277930 A1 * | 12/2007 | Yokoyama et al. ...... | 156/345.31 |
| 2008/0083501 A1 | 4/2008 | Arai et al. | |
| 2008/0230534 A1 * | 9/2008 | Winkler et al. ............... | 219/390 |

(Continued)

FOREIGN PATENT DOCUMENTS

| | | |
|---|---|---|
| JP | 09-290197 A1 | 11/1997 |
| JP | 11-260779 A1 | 9/1999 |

(Continued)

OTHER PUBLICATIONS

Japanese Office Action (Application No. 2011-240325) dated Jan. 6, 2015.

*Primary Examiner* — Michael Barr
*Assistant Examiner* — Spencer Bell
(74) *Attorney, Agent, or Firm* — Burr & Brown, PLLC

(57) ABSTRACT

Disclosed is a liquid treatment apparatus for processing a lower surface of the substrate. The apparatus includes a first nozzle disposed below a lower surface of the substrate retained by the substrate retaining unit to eject a treatment liquid towards the lower surface of the substrate, the first nozzle having a plurality of first ejection ports, which are arrayed from a position opposing a central portion of the substrate retained by the substrate retaining unit to a position opposing a peripheral portion of the substrate retained by the substrate retaining unit. An ejecting direction of the treatment liquid ejected from the first ejection port is inclined towards a rotation direction of the substrate rotated by the rotational driving unit.

14 Claims, 14 Drawing Sheets

(56) References Cited

U.S. PATENT DOCUMENTS

2009/0056758 A1* 3/2009 Ito et al. .................... 134/18
2010/0083986 A1* 4/2010 Kamikawa et al. ............ 134/18

FOREIGN PATENT DOCUMENTS

| | | | |
|---|---|---|---|
| JP | 2003-197591 | A1 | 7/2003 |
| JP | 2005-353739 | A1 | 12/2005 |
| JP | 2007-180144 | A1 | 7/2007 |
| JP | 2007-318140 | A1 | 12/2007 |
| JP | 2008-118086 | A1 | 5/2008 |
| JP | 2008-130763 | A1 | 6/2008 |
| JP | 2008-288604 | A1 | 11/2008 |

* cited by examiner

SUBSTRATE LIQUID TREATMENT APPARATUS WITH LIFT PIN PLATE

CROSS-REFERENCE TO RELATED APPLICATION

This application is based on and claims the benefit of priorities from both Japanese Patent Application No. 2010-293775 filed on Dec. 28, 2010, and Japanese Patent Application No. 2011-240325 filed on Nov. 1, 2011, the entire contents of which are incorporated herein by reference.

BACKGROUND OF THE INVENTION

1. Field of the Invention

The present disclosure relates to a liquid treatment apparatus and a liquid treatment method used to conduct liquid treatment such as cleaning and etching for substrates by supplying a treatment liquid to a lower surface of the substrate while spinning it.

2. Description of the Related Art

There have been known conventional substrate cleaning apparatuses that clean substrates such as semiconductor wafers (hereinafter, also referred to simply as "wafer(s)") by supplying a cleaning liquid to a substrate which is rotating and held in horizontal posture.

JP9-290197A describes a substrate processing apparatus that includes a spin chuck for retaining a wafer in horizontal posture and rotating the wafer; and a cleaning liquid supply pipe extending inside a rotating shaft of the spin chuck and having an opening for ejecting cleaning liquid towards the center of the lower surface of the wafer retained by the spin chuck. The peripheral area of the wafer lower surface may not be sufficiently cleaned if the cleaning liquid is ejected towards the center of the lower surface of the wafer W.

JP2005-353739A describes a substrate processing apparatus that includes a spin chuck for retaining the wafer in horizontal posture and rotating the wafer; and a two-fluid nozzle for jetting a two-fluid spray towards the upper surface of the wafer retained by the spin chuck. The two-fluid spray is formed from a nitrogen gas and a treatment liquid such as a chemical liquid and is jetted in a band-like form having a length nearly equivalent to the radius of the wafer. JP2005-353739A suggests that such a two-fluid nozzle may also be disposed below the lower surface of the wafer to clean the lower surface. However, a specific configuration of such an arrangement is not disclosed.

JP2008-130763A describes a substrate processing apparatus that includes a spin chuck for retaining the wafer in horizontal posture and rotating the wafer; a two-fluid nozzle for jetting a two fluid spray towards the upper surface of the wafer retained by the spin chuck, the two fluid spray being a mixture of a nitrogen gas and a treatment liquid such as a chemical liquid and is jetted in a band-like form having a length nearly equivalent to a diameter of the wafer; and another nozzle for ejecting a treatment fluid such as deionized water (DIW) towards the central portion of the upper surface of the wafer W. In the apparatus of JP2008-130763A, when a two-fluid nozzle jets a two fluid-spray onto the upper surface of a wafer W, the two-fluid nozzle scans the upper surface of the wafer W which is not rotating. Cleaning of the lower surface of the wafer W is not described in JP2008-130763A.

SUMMARY OF THE INVENTION

The present disclosure provides a liquid treatment apparatus and a liquid treatment method capable of treating the lower surface of a substrate efficiently.

In one aspect, there is provided a liquid treatment apparatus, which includes: a substrate retaining unit comprising a retaining member configured to hold a peripheral edge of a substrate to retain the substrate horizontally; a rotational driving unit configured to rotate the substrate retaining unit; a first nozzle disposed below a lower surface of the substrate retained by the substrate retaining unit to eject a treatment liquid towards the lower surface of the substrate, the first nozzle comprising a plurality of first ejection ports, which are arrayed from a position opposing a central portion of the substrate retained by the substrate retaining unit to a position opposing a peripheral portion of the substrate retained by the substrate retaining unit; and a liquid supply mechanism that supplies a treatment liquid to the first ejection ports, wherein each of the first ejection ports is configured to eject the treatment liquid towards the lower surface of the substrate in an ejecting direction which is inclined towards a rotation direction of the substrate rotated by the rotational driving unit.

In another aspect, there is provided a liquid treatment method, which includes: retaining a substrate in a horizontal posture; providing a first nozzle comprising a plurality of first ejection ports below a lower surface of the substrate retained by the substrate retaining unit such that the first ejection ports are arrayed from a position opposing a central portion of the substrate to a position opposing a peripheral portion of the substrate; rotating the substrate; and ejecting a treatment liquid from the first ejection ports toward a lower surface of the substrate in ejecting directions each having a component in a rotation direction of the substrate.

In the foregoing aspects, due to the provision of the first ejection ports which are arrayed from a position opposing a central portion of the substrate to a position opposing a peripheral portion of the substrate, a treatment liquid can be supplied to the lower surface of the substrate with high uniformity. In addition, since the ejecting direction of the treatment liquid ejected from the first ejection port towards the lower surface of the substrate is inclined towards a rotation direction of the substrate, bouncing (splash-back) of the treatment liquid upon collision against the lower surface of the wafer W can be suppressed, resulting in improved efficiency of the treatment.

DETAILED DESCRIPTION OF THE INVENTION

An embodiment of a liquid treatment apparatus will be described with reference to the accompanying drawings.

Figure 1:
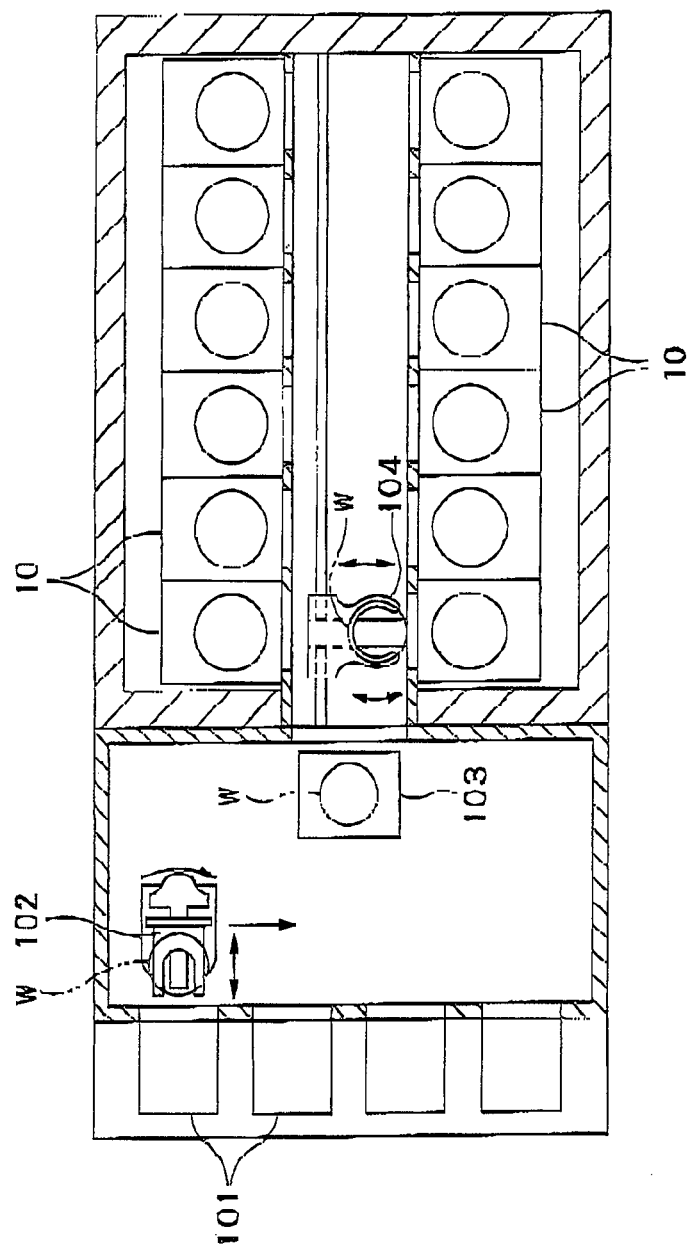
FIG. 1 is a top plan view of a liquid treatment system which includes substrate cleaning apparatuses in one embodiment.

First, a liquid treatment system including a substrate cleaning apparatus in one embodiment of a liquid treatment apparatus will be described below with reference to FIG. 1. As shown in FIG. 1, the liquid treatment system includes: mounting tables 101 each for mounting thereon a carrier accommodating a semiconductor wafer W (i.e., substrate to be processed) (hereinafter, simply referred to as "wafer W") which is transported thereto from the outside of the system; a transport arm 102 for removing the wafer W from the carrier; a shelf unit 103 for placing thereon the wafer W removed from the carrier by the transport arm 102; and a transport arm 104 for receiving the wafer W from the shelf unit 103 and for transporting the wafer W to the substrate cleaning apparatus 10. As shown in FIG. 1, a plurality of (twelve, in the embodiment of FIG. 1) substrate cleaning apparatuses are installed in the liquid treatment system.

Next, a schematic configuration of the substrate cleaning apparatus 10 is described below with reference to FIGS. 2A and 2B. The substrate cleaning apparatus 1.0 includes: a retaining plate 30 retaining the wafer W; a lift pin plate 20 provided above the retaining plate 30 and including lift pins 22 to support thereon the wafer W from below; a rotational driving unit 39 equipped with an electric motor or the like to rotate the retaining plate 30; a treatment fluid supply pipe 40 routed through a through-hole 30a formed centrally in the retaining plate 30 and a through-hole 20a formed centrally in the lift pin plate 20; and a bar-shaped nozzle 60 for ejecting treatment fluids supplied via the treatment fluid supply pipe 40 towards the lower surface of the wafer W. The lift pin plate 20 is configured to rotate with being interlocked with the retaining plate 30.

The lift pin plate 20, the treatment fluid supply pipe 40, and the bar-shaped nozzle 60 can be moved vertically relative to the retaining plate 30. FIG. 2A shows a state where the lift pin plate 20, the treatment fluid supply pipe 40, and the bar-shaped nozzle 60 are positioned at their respective lowered positions. FIG. 2B shows a state where the lift pin plate 20, the treatment fluid supply pipe 40, and the bar-shaped nozzle 60 are positioned at their respective raised positions. The lift pin plate 20, the treatment fluid supply pipe 40, and the bar-shaped nozzle 60 can be moved up and down between the lowered positions as shown in FIG. 2A and the raised positions as shown in FIG. 2B.

Next, constituent elements of the substrate cleaning apparatus are described in detail below.

Figure 3:
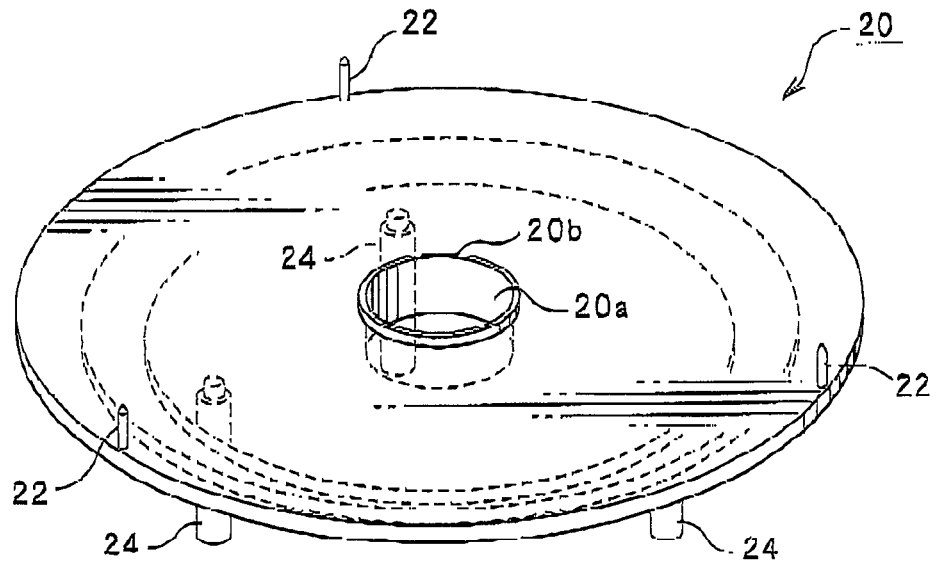
FIG. 3 is a perspective view showing the configuration of the lift pin plate of the substrate cleaning apparatus shown in FIGS. 2A and 2B.

As shown in FIG. 3, the lift pin plate 20 has a disk-like shape with the through-hole 20a formed in its central portion. An annular protrusion 20b is provided around the through-hole 20a to prevent a liquid on the lift pin plate 20 from entering the through-hole 20a. The treatment fluid supply pipe 40 is routed through the through-hole 20a. A plurality of (three or four) lift pins 22 are provided on the upper surface of the lift pin plate 20. The lift pins 22 are arranged at equal angular intervals on a circumference near the peripheral edge of the lift pin plate 20. Three rod-like connecting members 24 extend downward from the lower surface (i.e., the surface opposite to the surface provided with the lift pins 22) of the lift pin plate 20. The connecting members 24 are arranged at equal angular intervals on a circumference near the peripheral edge of the lift pin plate 20.

Figure 4:
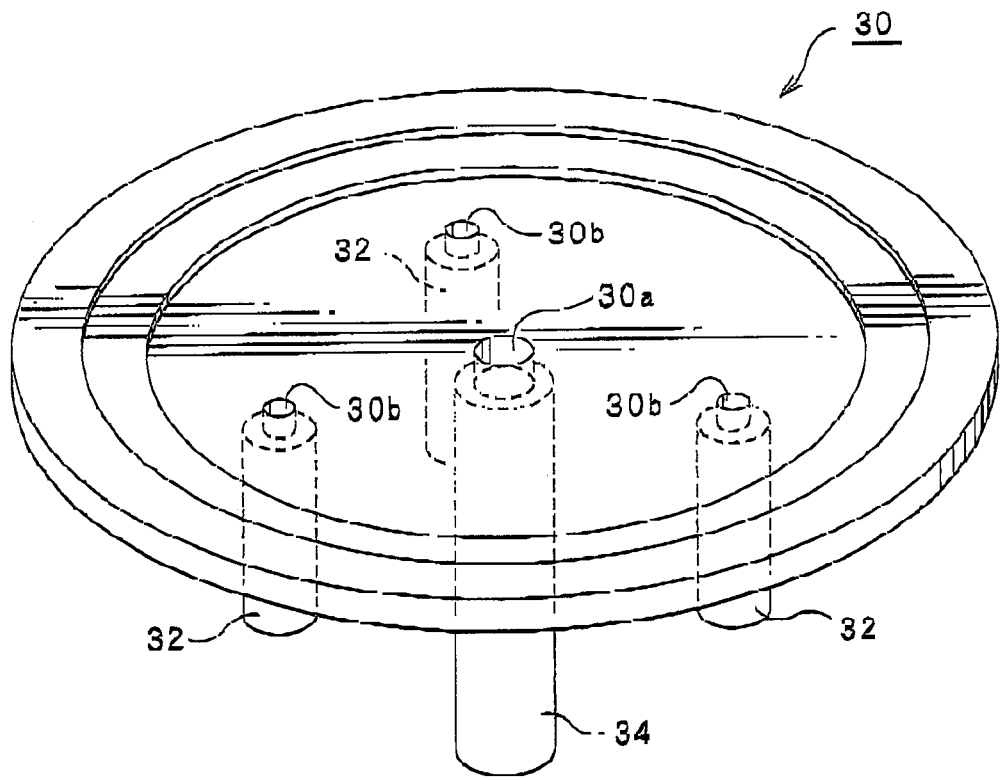
FIG. 4 is a perspective view showing the configuration of a retaining plate of the substrate cleaning apparatus shown in FIGS. 2A and 2B.

As shown in FIG. 4, the retaining plate 30 has a disk-like shape with the through-hole 30a formed in its central portion. The treatment fluid supply pipe 40 is routed through the through-hole 30a. A rotary cup 36 is attached to the retaining plate 30 via a connecting member 38 as shown in FIG. 2A. When the lift pin plate 20, the treatment fluid supply pipe 40, and the bar-shaped nozzle 60 are at their lowered positions, the rotary cup 36 encircles the peripheral edge of the wafer W retained by the retaining plate 30. As shown in FIGS. 2A and 2C, two fixed retaining members 37 are attached to the rotary cup 36 to retain the wafer W. The detailed function of the fixed retaining members 37 will be described later. Instead of attaching the fixed retaining members 37 to the rotary cup 36, they may be connected to the retaining plate 30, or may be directly attached to the connecting member 38. If the fixed retaining members 37 are attached directly to the connecting member 38, the fixed retaining members 37 can be enhanced in strength against a force applied from a horizontal direction.

A hollow rotating shaft 34 is attached to the central portion of the lower surface of the retaining plate 30 (i.e., the surface opposite to the surface equipped with the rotary cup 36) to extend downward therefrom. The treatment fluid supply pipe 40 is accommodated in the cavity of the hollow rotating shaft 34. The rotating shaft 34 is supported by a bearing (not shown) and is rotated by the rotational driving unit 39 comprising an electric motor and so on. The rotational driving unit 39 rotates the rotating shaft 34, thus rotating the retaining plate 30 as well.

As shown in FIG. 4, three through-holes 30b (connecting member through-holes) are formed in the retaining plate 30. The connecting members 24 coupled to the lift pin plate 20 are each inserted slidably in the through-hole 30b. The connecting members 24 connect the retaining plate 30 and the lift pin plate 20 for their integral rotation while preventing relative rotation between them; the connecting members 24 permit relative vertical movement between the retaining plate 30 and the lift pin plate 20. The through-holes 30b are arranged in the retaining plate 30 at equal angular intervals on a circumference on the retaining plate 30. In addition, on the lower surface of the retaining plate 30, the through-holes 30b are provided with three accommodation members 32 having a cylindrical shape. The accommodation members 32 extend downward from the lower surface of the retaining plate 30 and accommodate the connecting members 24 extending downward from the lower surface of the lift pin plate 20. The accommodation members 32 are arranged at equal angular intervals on a circumference near a peripheral area of the retaining plate 30.

Figure 5:
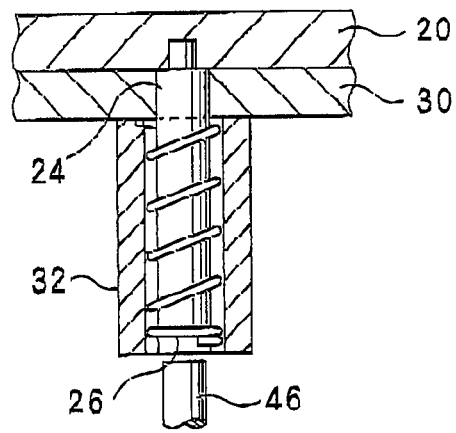
FIG. 5 is an enlarged vertical cross sectional view showing the configuration of a connecting member extending downward from the lift pin plate and a hollow accommodation member extending downward from the retaining plate and accommodating the connecting member in the substrate cleaning apparatus shown in FIGS. 2A and 2B.

Referring to FIG. 5, a further detailed description will be made for the connecting members 24 extending downward from the lower surface of the lift pin plate 20, and the accommodation members 32 extending downward from the lower surface of the retaining plate 30. As shown in FIG. 5, the cylindrical accommodation member 32 has an inside diameter slightly greater than an outside diameter of the connecting member 24. The connecting member 24 can move in a longitudinal direction of the accommodation member 32 (i.e., vertical direction in FIG. 5) in the accommodation member 32. As shown in FIG. 2A, when the lift pin plate 20 is at its lowered position, the connecting member 24 is completely received in the accommodation member 32. Meanwhile, as shown in FIG. 2B, when the lift pin plate 20 is at its raised position, only a lower portion of the connecting member 24 is received in the accommodation member 32. The connecting member 24 passes through the through-hole 30b in the retaining plate 30 and protrudes upward from the retaining plate 30.

As shown in FIG. 5, a spring 26 is installed in the cavity of the accommodation member 32 in a compressed state. The lower end of the spring 26 is connected to the bottom of the connecting member 24 while its upper end is connected to the lower surface of the retaining plate 30 in the vicinity of the through-hole 30b. Thus, the spring 26 urges the connecting member 24 downward. In other words, force of the spring 26 to return from the compressed state to an original state exerts a downward force upon the connecting member 24 (i.e., force to move downward from the retaining plate 30).

Figure 2A:
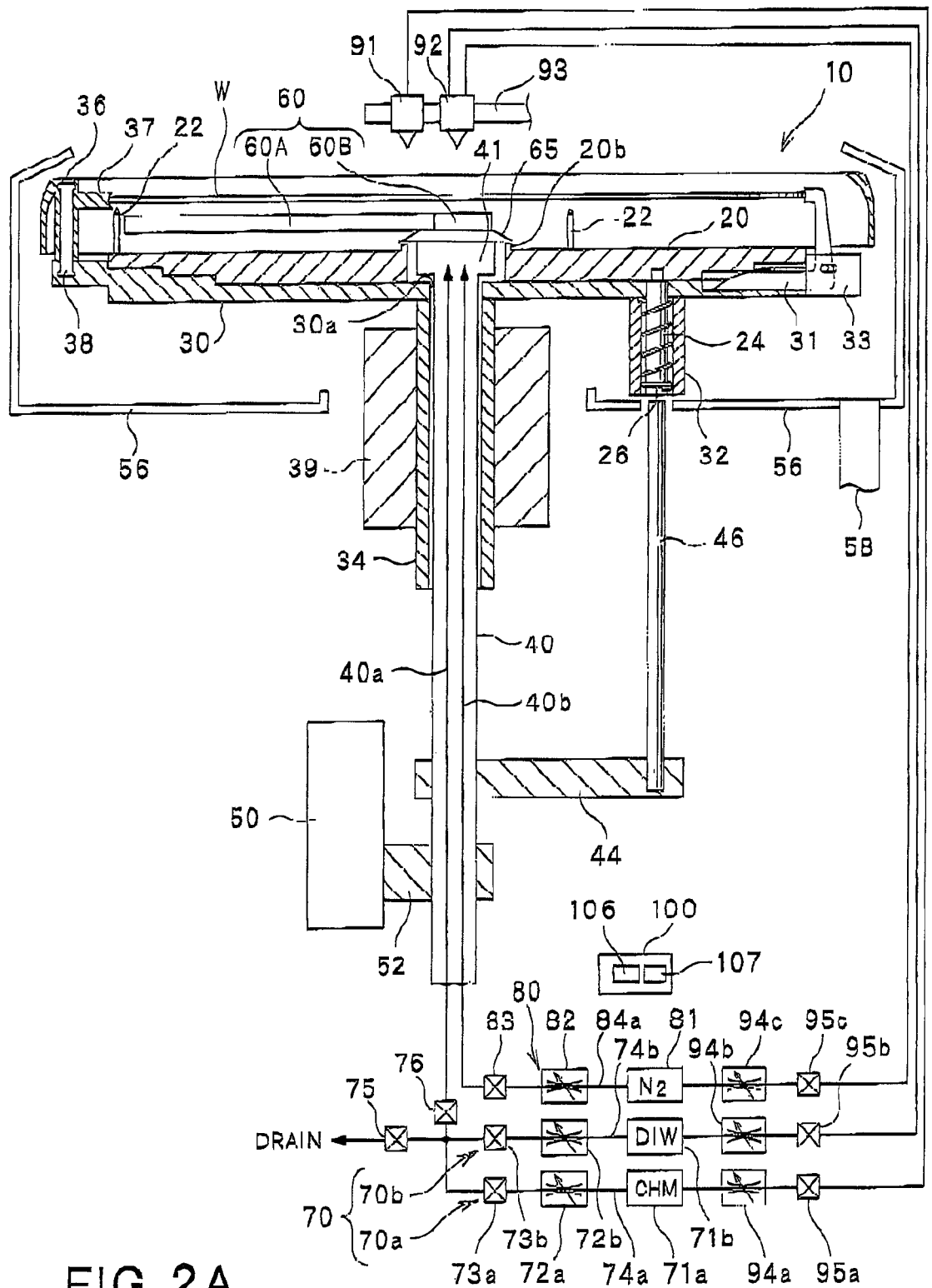
FIG. 2A is a vertical cross sectional view showing the configuration of the substrate cleaning apparatus in a state where a lift pin plate and a cleaning liquid supply pipe are located at their lowered positions.
Figure 2B:
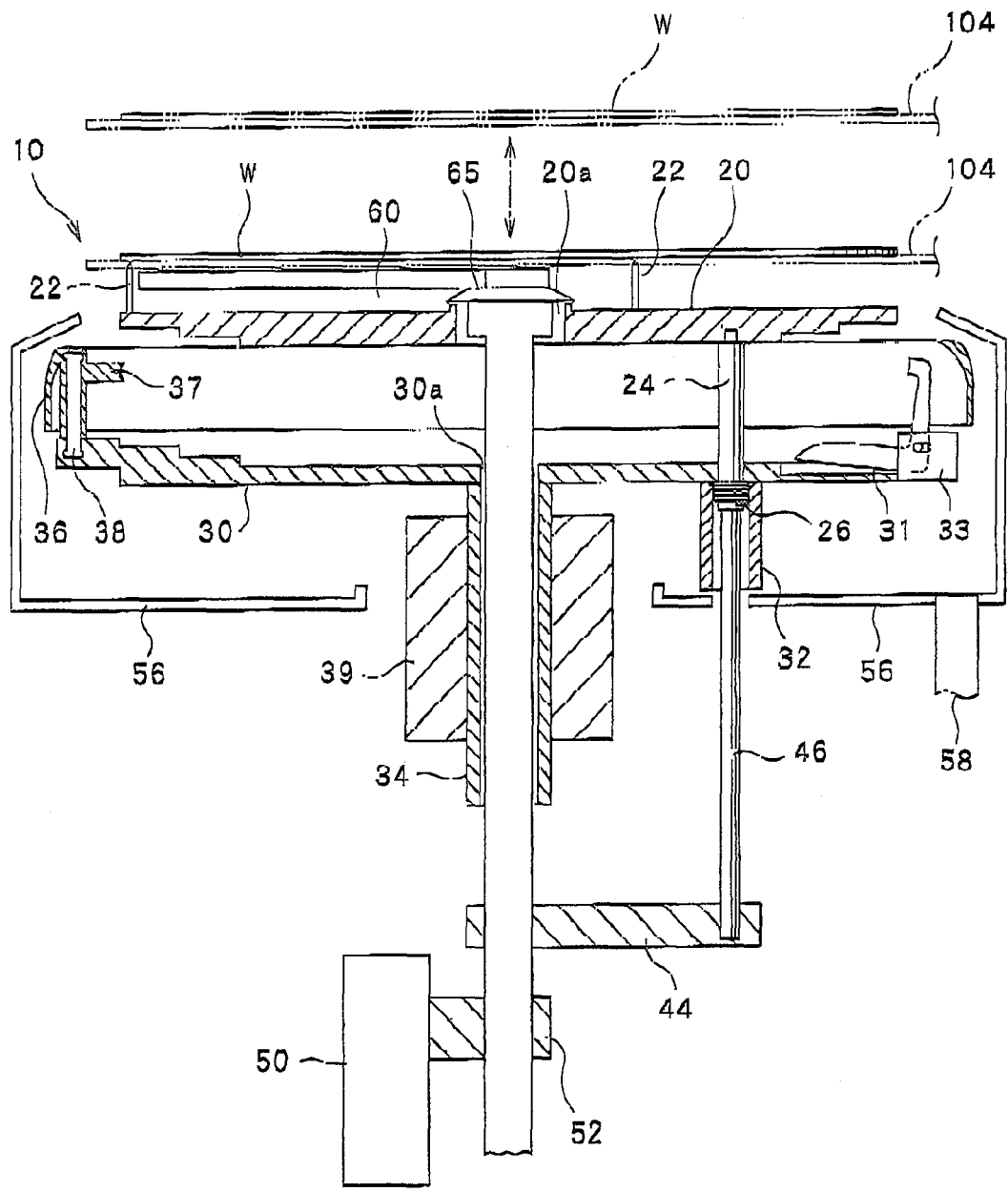
FIG. 2B is a vertical cross sectional view showing the configuration of the substrate cleaning apparatus in a state where the lift pin plate and the cleaning liquid supply pipe are located at their raised positions.
Figure 2C:
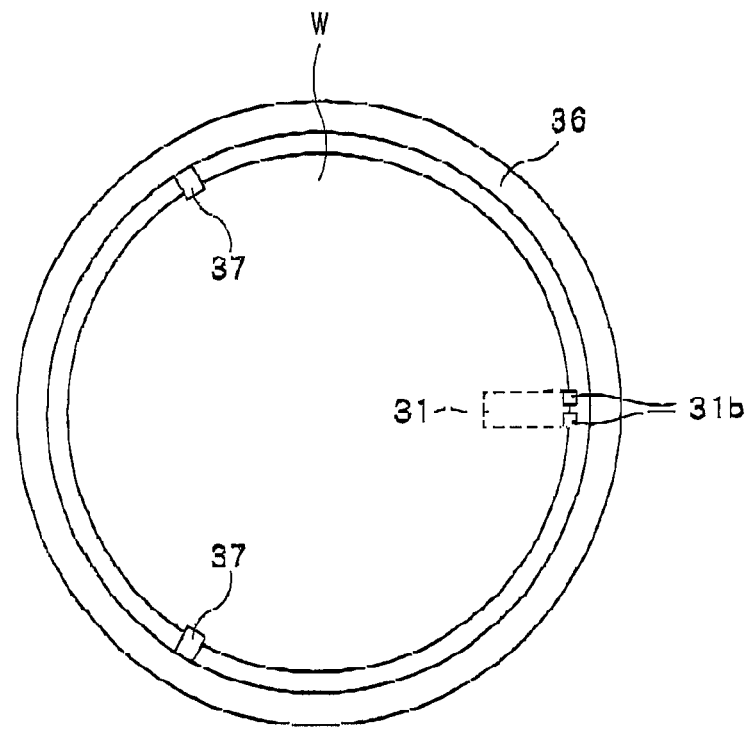
FIG. 2C is a top plan view of the substrate cleaning apparatus in a state where a wafer is retained by a substrate retaining member and fixed retaining members as shown in FIG. 2A.

As shown in FIGS. 2A and 2B, an outer cup 56 is provided outside the rotary cup 36 to surround the retaining plate 30 and the rotary cup 36. In addition, a drainage tube 58 is connected to the outer cup 56. During cleaning of a wafer W, used cleaning liquid scatters outward from the wafer W due to its rotation. The scattered liquid will be received by the outer cup 56 and is drained through the drainage tube 58.

As can be seen in FIG. 2A, a movable, substrate retaining member 31 for supporting the wafer W from the lateral side of the wafer W is provided on the retaining plate 30. When the lift pin plate 20 is at its lowered position as in FIG. 2A, the substrate retaining member 31 supports the wafer W from its lateral side. When the lift pin plate 20 is at its raised position as shown in FIG. 2B, the substrate retaining member 31 is separated away from the wafer W. The operation of the substrate retaining member 31 will be described more specifically with reference to FIG. 2C. During wafer cleaning, the wafer W is retained by the substrate retaining member 31 and the two fixed retaining members (i.e., non-movable, substrate-retaining members) 37. At this time, the substrate retaining member 31 presses the wafer W against the two fixed retaining members 37. That is, the substrate retaining member 31 applies to the wafer W a leftward force to press the wafer W against the fixed retaining members 37. In the illustrated embodiment, since the wafer W is retained by two fixed retaining members 37 and only one movable substrate-retaining member 31, the configuration for retaining the wafer W can be more simplified as compared with a configuration employing a plurality of movable substrate retaining members 31 with no fixed retaining member 37.

Then, the configuration of the substrate retaining member 31 will be detailed below referring to FIGS. 6 to 8.

Figure 6:
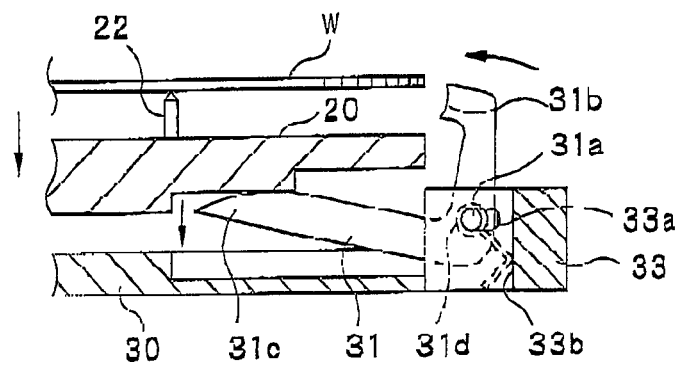
FIG. 6 is an enlarged vertical cross sectional view showing the configuration of the substrate retaining member provided on the retaining plate in the substrate cleaning apparatus shown in FIGS. 2A and 2B.

FIG. 6 shows a state where the lift pin plate 20 is moving from its raised position as in FIG. 2B to its lowered position as in FIG. 2A. FIG. 7 shows a state where the lift pin plate has moved more downward from the state shown in FIG. 6. FIG. 8 shows a state where the lift pin plate 20 has moved further downward from the state of FIG. 7 to reach the lowered position as shown in FIG. 2A.

Figure 7:
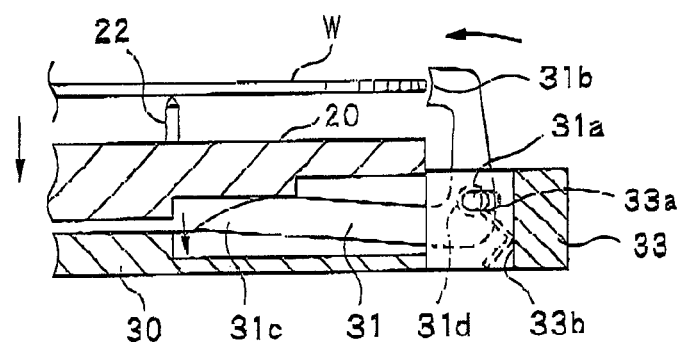
FIG. 7 is an enlarged vertical cross sectional view showing a state where the lift pin plate has been moved downward from the state shown in FIG. 6.
Figure 8:
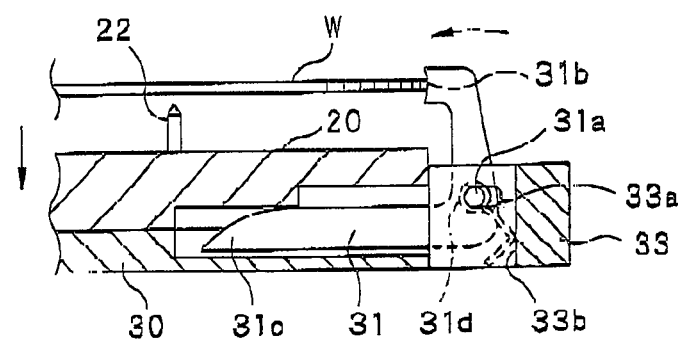
FIG. 8 is an enlarged vertical cross sectional view showing a state where the lift pin plate has been moved further downward from the state shown in FIG. 7.

As shown in FIGS. 6 to 8, the substrate retaining member 31 is supported by the retaining plate 30 via an axle 31a. More specifically, a bearing unit 33 is attached to the retaining plate 30, and an axle receiving hole 33a of the bearing unit 33 receives the axle 31a. The axle receiving hole 33a is an elongated hole extending in a horizontal direction, and the substrate retaining member 31 can move horizontally along the axle receiving hole 33a. The substrate retaining member 31 can thus swing around the axle 31a accommodated within the axle receiving hole 33a of the bearing unit 33.

A spring member 31d such as a torsion spring is wound around the axle 31a of the substrate retaining member 31. The spring member 31d is adapted to impart the substrate retaining member 31a force to rotate the substrate retaining member 31 around the axle 31a in the clockwise direction in FIGS. 6 to 8. Thus, when no force is applied to the substrate retaining member 31, the substrate retaining member 31 inclines with respect to the retaining plate 30, as shown in FIG. 2B. A substrate retaining portion 31b (described later) of the substrate retaining member 31, provided to hold the wafer W from its lateral side, then moves away from a central portion of the retaining plate 30.

The spring member 31d has a linear portion extending outward from the axle 31a to an inner well 33b of the bearing unit 33. The linear portion is engaged with the inner wall 33b, thereby pushing back the axle 31a towards the center of the retaining plate 30. The axle 31a is thus constantly pushed towards the center (leftward in FIGS. 6 to 8) of the retaining plate 30 by the linear portion of the spring member 31d. When the movable substrate retaining member 31 and the fixed retaining members 37 are supporting a wafer W having a relatively small diameter, the axle 31e is positioned in the axle receiving hole 33a at a position nearer to the center (left side)

of the retaining plate 30, as shown in FIGS. 6 to 8. When the movable substrate-retaining member 31 and the fixed retaining members 37 is supporting a wafer W having a relatively large diameter, the axle 31a moves rightward along the axle receiving hole 33a from the position shown in FIGS. 6 to 8, against the force applied by the linear portion of the spring member 31d. The magnitude of the wafer diameter (small/large diameter) here refers to a magnitude that falls within a tolerance range.

The substrate retaining member 31 has, in addition to the substrate retaining portion 31b that retains the wafer W from its lateral side, a pressure receiving member 31c at the side opposite to the substrate retaining portion 31b with respect to the axle 31a. The pressure receiving member 31c is set between the lift pin plate 20 and the retaining plate 30. When the lift pin plate 20 is at or near the lowered position, the lower surface of the lift pin plate 20 pushes the pressure-receiving member 31c downward as shown in FIGS. 6 to 8.

While the lift pin plate 20 moves from its raised position to its lowered position, the lower surface of the lift pin plate 20 pushes the pressure receiving member 31c downward. Then, the substrate retaining member 31 rotates counterclockwise around the axle 31a (in a direction shown by the arrows in FIGS. 6 to 8). This rotation of the substrate retaining member 31 around the axle 31a renders the substrate retaining portion 31b to approach the wafer W from its lateral side. The wafer W is held from its lateral side by the substrate retaining member 31, as the lift pin plate 20 reaches the lowered position as in FIG. 8. At this time when the wafer W is held at its lateral side by the substrate retaining member 31, the wafer W is separated from the tip of each lift pin 22 and is held above the lift pins 22. Depending on the size of the wafer W, the axle 31a may slide rightwards along the axle receiving hole 33a from the position shown in FIGS. 6 to 8, against the force applied by the linear portion of the spring member 31d. Therefore, the wafer W can be held from its lateral side without deforming nor damaging it even if the substrate retaining member 31 and the fixed retaining members 37 hold a relatively large wafer W, because the substrate retaining member 31 can shift in the horizontal direction.

By employing such substrate retaining member 31, the substrate cleaning apparatus 10 do not need a special driving mechanism (motive energy source) for driving a substrate retaining member 31. The substrate retaining member 31 of the retaining plate 30 can retain and release a wafer W just by vertically moving the lift pin plate 20 using a vertical driving unit 50 (described later). The configuration of the substrate cleaning apparatus 10 can thus be simplified. It also reduces the time lag between the timing of raising and lowering of the lift pin plate 20 and the timing of the action of the substrate retaining member 31, whereby improving throughput.

As shown in FIGS. 2A and 2B, the treatment fluid supply pipe 40 is arranged to pass through both the through-hole 20a in the lift pin plate 20 and the through-hole 30a in the retaining plate 30. The treatment fluid supply pipe 40 is arranged such that it does not rotate when the lift pin plate 20 and the retaining plate 30 rotate. Extending through the treatment fluid supply pipe 40 in the axial direction thereof are: a liquid supply passage 40a through which, as a cleaning liquid, a chemical liquid such as DHF (dilute hydrofluoric acid) solution and SC1 (Standard Clean 1) solution, and a rinse liquid such as DIW (deionized water) flows; and a gas supply passage 40b through which a gas, such as an inert gas, e.g., $N_2$ gas flows. The bar-shaped nozzle 60 which will be detailed later is attached to the upper end of the treatment fluid supply pipe 40.

Figure 9:
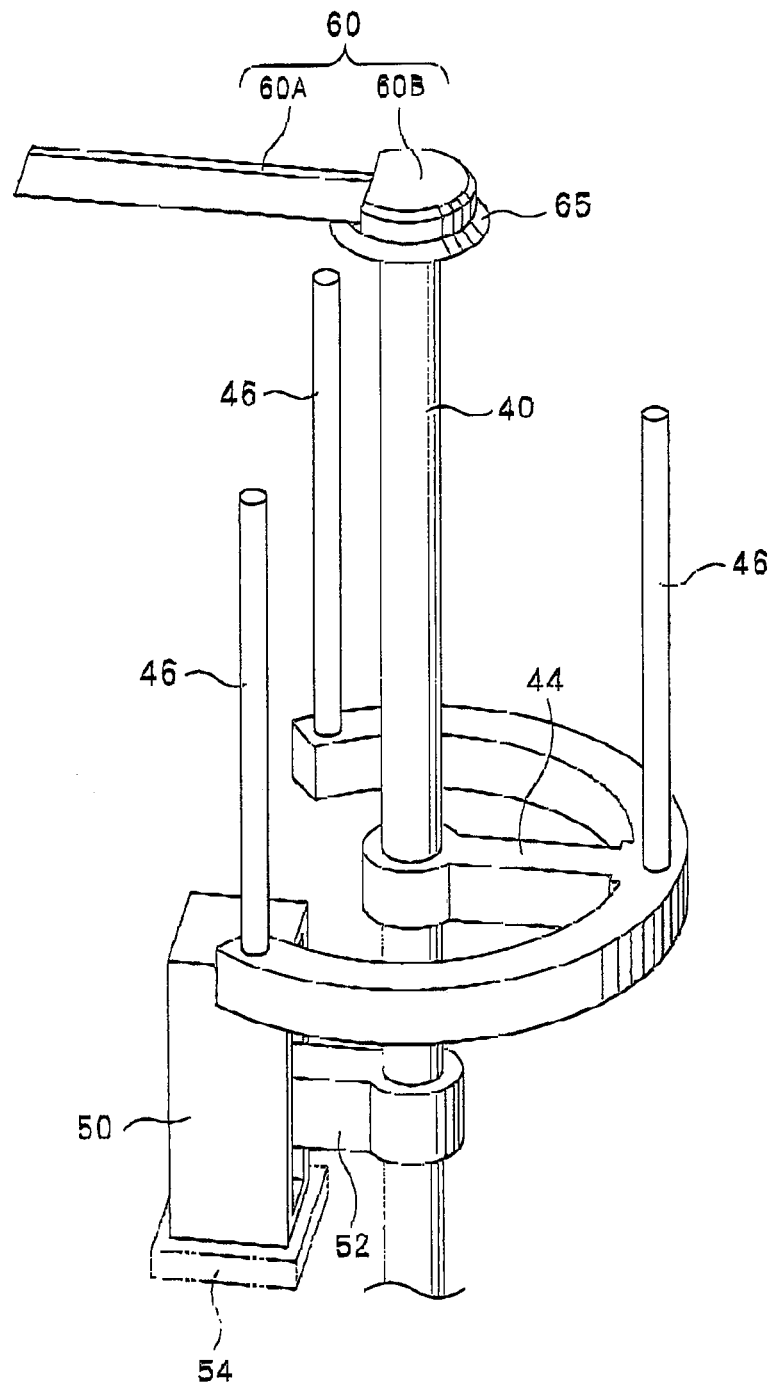
FIG. 9 is a perspective view showing the configuration of a treatment fluid supply pipe and bar-shaped nozzle in the substrate cleaning apparatus shown in FIGS. 2A and 2B, and the configuration of a lifting mechanism for vertically moving them.

As shown in FIGS. 2A, 2B, and 9, the vertical driving unit 50 is connected with the treatment fluid supply pipe 40 via a connecting member 52. The vertical driving unit 50 is configured to move the treatment fluid supply pipe 40 vertically. That is, by raising/lowering the connecting member 52, the vertical driving unit 50 moves the treatment fluid supply pipe 40 and bar-shaped nozzle 60 connected to the connecting member 52. More specifically, the vertical driving unit 50 raises/lowers the treatment fluid supply pipe 40 and the bar-shaped nozzle 60 between their lowered positions as in FIG. 2A and their raised positions as in FIG. 2B.

As shown in FIG. 9, the treatment fluid supply pipe 40 is further attached with a first interlocking member 44. Three rod-shaped second interlocking members 46 are connected to the first interlocking member 44 to extend upward therefrom. The second interlocking members 46 are arranged to correspond to the connecting members 24 extending downward from the lift pin plate 20. The outer diameter of the second interlocking member 46 is smaller than the inner diameter of the cylindrical accommodation member 32. That is to say, each second interlocking member 46 is arranged to contact the bottom of one connecting member 24 so that the second interlocking member 46 can push the connecting member 24 upward within the accommodation member 32, as shown in FIG. 2B.

Accordingly, when the vertical driving unit 50 moves the treatment fluid supply pipe 40 upward from the state shown in FIG. 2A, the first interlocking member 44 and second interlocking members 46 joined with the treatment fluid supply pipe 40 also moves upward so that the second interlocking members 46 push the connecting members 24 upward inside the accommodation members 32, whereby the lift pin plate 20 moves integrally with the treatment fluid supply pipe 40 so that the lift pin plate 20, the treatment fluid supply pipe 40, and the bar-shaped nozzle 60 thus reach their raised positions as in FIG. 2B. On the other hand, when the vertical driving unit 50 moves the treatment fluid supply pipe downward from the state shown in FIG. 2B, since the spring 26 set within the accommodation member 32 constantly applies a downward force to the connecting member 24, the connecting member 24 descends downward integrally with the interlocking member 46 with its bottom being in contact with the top of the second interlocking member 46. The lift pin plate 20, the treatment fluid supply pipe 40, and the bar-shaped nozzle 60 thus reach their respective lowered positions as in FIG. 2A.

The lift pin plate 20 adjoins the retaining plate 30 when the lift pin plate 20 is positioned at its lowered position, as shown in FIG. 2A. In the illustrated embodiment, the lift pin plate 20 is rested on and supported by the retaining plate 30. On the other hand, the lift pin plate 20 is separated from the retaining plate 30 when the lift pin plate 20 is positioned at its raised position, as shown in FIG. 2B. The wafer W is then supported by the lift pins 22 and can be removed therefrom.

As mentioned above, the liquid treatment apparatus includes an interlocking mechanism having the first interlocking member 44 and the three second interlocking members 46 for integrally raising and lowering the lift pin plate 20, the treatment fluid supply pipe 40, and the bar-shaped nozzle 60. The liquid treatment apparatus also includes a lifting mechanism for integrally raising and lowering the lift pin plate 20, the treatment fluid supply pipe 40, and the bar-shaped nozzle 60 relative to the retaining plate 30 by employing the first interlocking member 44, the three second interlocking members 46, the vertical driving unit 50 and the connecting member 52.

Next, the configuration of the bar-shaped nozzle 60 will be described below with reference to FIGS. 2A, 2B, 9, and 10.

The bar-shaped nozzle 60 includes a bar-shaped portion 60A and a central portion 60B. The bar-shaped nozzle 60 is attached via the central portion 60B to the upper end of the treatment fluid supply pipe 40. The central portion 60B also serves as a covering member for covering the through-hole 20a in the lift pin plate 20. The bar-shaped portion 60A extends from the central portion 60B in a radially outward direction of the lift pin plate 20, that is, a radially outward direction of the wafer W, and terminates slightly before an imaginary circle along which the lift pins 22 are arranged so as not to interfere with the pins 22.

Figure 10:
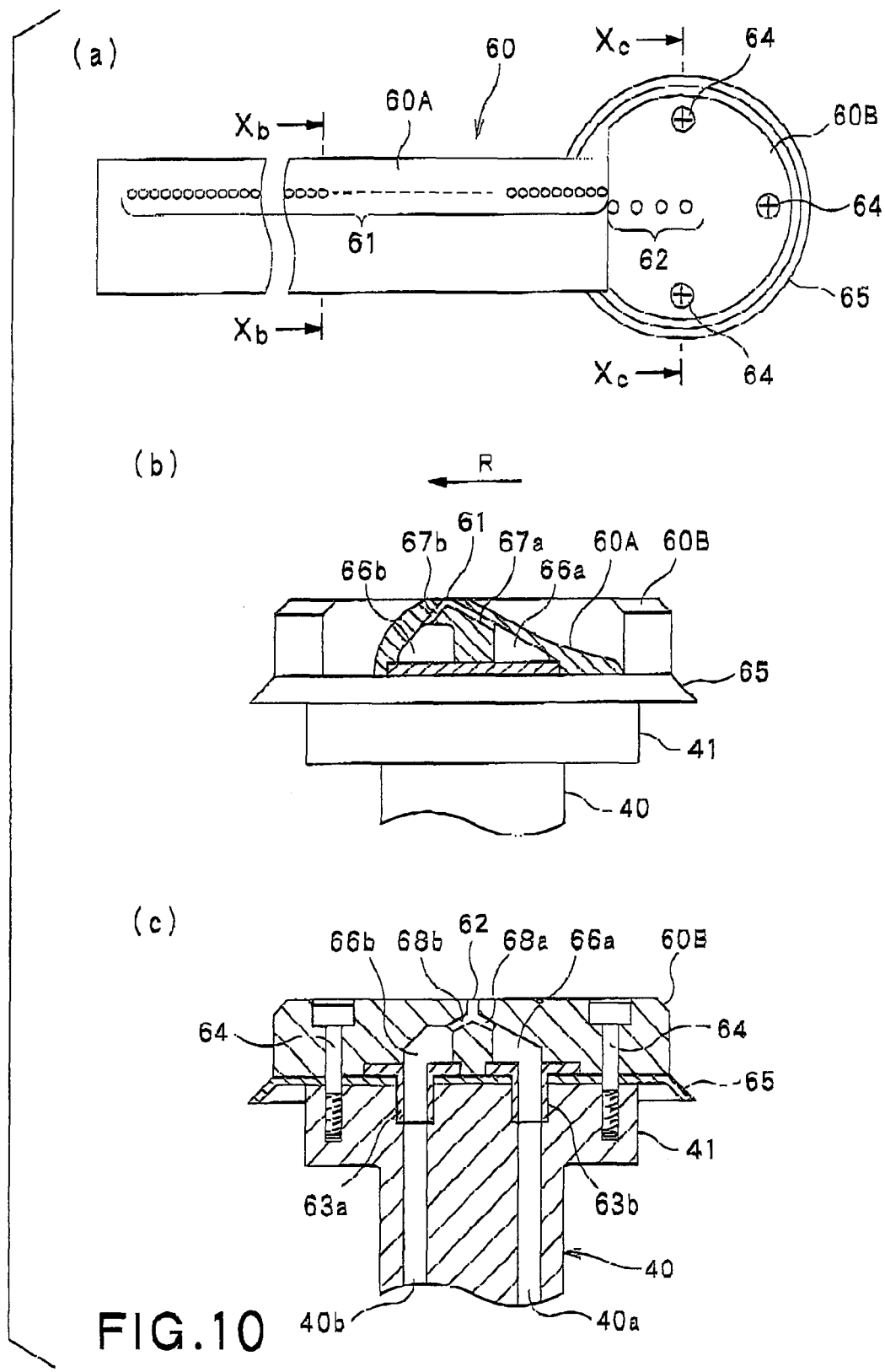
FIG. 10 is for explanation of the configuration of the treatment fluid supply pipe and the bar-shaped nozzle, wherein (a) is a top plan view, (b) is a vertical cross sectional view taken along line Xb-Xb of (a), and (c) is a vertical cross sectional view taken along line Xc-Xc of (a)

As shown in FIG. 10, the bar-shaped portion 60A has a cross section like an airfoil. In this liquid treatment apparatus, the wafer W rotates in a direction of the arrow R shown in FIG. 10(b) with respect to the bar-shaped portion 60A. The rotation of the wafer W generates an airstream flowing in the direction of the arrow R in the space between the lower surface of the wafer W and the lift pin plate 20. This airstream passing through the space above the bar-shaped portion 60A improves the flow of the liquid. More specifically, as the airstream passes through a space between the back side of the bar-shaped portion 60A and the wafer W, the airstream will be accelerated by the throttle effect and deflected in a direction towards the lower surface of the wafer W. Such airstream assists the treatment liquid (e.g., a chemical liquid) that has collided with the lower surface of the wafer W to spread more smoothly over the lower surface. In addition, since the bar-shaped portion 60A has a cross section like an airfoil, vibration of the bar-shaped portion 60A due to the airstream can be suppressed to a minimum.

The upper surface of the bar-shaped portion 60A is provided with a plurality of ejection ports 61 (first ejection ports) arranged in the longitudinal direction of the bar-shaped portion 60A. Their arrangement pitch may be between about 1 and 2 mm, and the hole diameter may be between about 0.2 and 0.5 mm. The central portion 60B is also provided with a plurality of ejection ports 62 (second ejection ports).

The treatment fluid supply pipe 40 has, at its upper end, a head 41 of an enlarged diameter. The central portion 60B of the bar-shaped nozzle 60 includes hollow engaging protrusions 63a and 63b on a lower surface of the central portion 60B. The liquid supply passage 40a and the gas supply passage 40b extending through the treatment fluid supply pipe 40 are opened at the upper surface of the head 41, into which the engaging protrusions 63e and 63b are fitted, respectively. A truncated conical cover 65 is attached to the lower surface of the central portion 60B to provide the central portion 60B with a function of a covering member for covering the through-hole 20a in the lift pin plate 20. The rim of the cover 65 is located above the circular protrusion 20b (see FIGS. 2A and 3) formed around the through-hole 20a in the lift pin plate 20. In this embodiment, the cover 65 is integrated with the central portion 60B of the bar-shaped nozzle 60 by jointing the head 41 of the treatment fluid supply pipe 40 and the central portion 60B together via bolts 64, with the cover 65 interposed between the central portion 60B and the head 41 of the treatment fluid supply pipe 40. The cover 65 may instead be initially formed integrally with the central portion 60B. Although the cover 55 is preferred to have a truncated conical shape, the shape of the cover 65 is not limited to that as illustrated, and any shape is possible as long as it covers the through-hole 20a and prevents liquid entering. Further, the cover 65 may be formed integrally with the head 41 of the treatment fluid supply pipe 40. The head 41 attached with the cover can be jointed with the central portion 608 to give the central portion 60B the function of a covering member.

The central portion 60B of the bar-shaped nozzle 60A houses a liquid passageway 66a and a gas passageway 66b which respectively communicates with the liquid supply passage 40a and the gas supply passage 40b. The liquid passageway 66a and the gas passageway 66b extend radially outward to the distal end portion of the bar-shaped portion 60A of the bar-shaped nozzle 60 (along the longitudinal direction of the bar-shaped nozzle 60), horizontally and in parallel to each other.

As shown in FIG. 10(b), each ejection port 61 on the bar-shaped portion 60A is connected to a liquid ejecting passage 67a and a gas ejecting passage 67b. The liquid ejecting passage 67a and the gas ejecting passage 67b are respectively connected with the liquid passageway 56a and the gas passageway 66b. The liquid ejecting passage 67a and the gas ejecting passage 67b meet at the upper surface or near the upper surface of the bar-shaped portion 60A (i.e., at the ejection port 61 or at its vicinity).

As shown in FIG. 10(c), each ejection port 62 on the central portion 60B is connected to a liquid-ejecting passage 68a and a gas-ejecting passage 68b. The liquid-ejecting passage 68a and the gas-ejecting passage 68b is respectively connected with the liquid passageway 66a and the gas passageway 66b. The liquid ejecting passage 68a and the gas ejecting passage 68b meet below the upper surface of the central portion 60B and the combined passage is lead to the ejection port 62. The aperture diameter of the ejection port 62 is larger than that of the ejection port 61.

Referring to FIG. 2A, the liquid supply passage 40a and gas supply passage 40b in the treatment fluid supply pipe 40 are respectively connected to a liquid supply mechanism 70 and a gas supply mechanism 80. The liquid supply mechanism 70 includes a first liquid supply unit 70a for supplying at least one kind of chemical liquid (one liquid in this embodiment) to the liquid supply passage 40a, and a second liquid supply unit 70b for supplying DIW (deionized water) as a rinsing liquid to the liquid supply passage 40a. The first liquid supply unit 70a is connected to a chemical liquid supply source (CHM) 71a containing DHF or SC1, etc. via a line 74a. The line 74a comprises, from the upstream side, a variable throttle valve 72a and an open/close valve 73a. Similarly, the second liquid supply unit 70b is connected to a DIW supply source 71b via a line 74b, and the line 74b is provided with a variable throttle valve 72b and an open/close valve 73b from the upstream side. The lines 74a and 74b meet at a downstream of the open/close valves 73a and 73b, and then connected to the liquid supply passage 40a. Open/close valves denoted by reference numbers 75 and 76 are used to drain liquids remained in the lines 74a and 74b. If it is necessary to supply two or more kinds of chemical liquids to the liquid supply passage 40a, for example, if SC1 cleaning and DHF cleaning is to be executed successively, an additional liquid supply unit having a similar configuration as that of the first liquid supply unit 70a may be provided in parallel.

The gas supply mechanism 80 is provided to supply gas such as an inert gas (in the illustrated embodiment, $N_2$ gas) to the gas supply passage 40b. The gas supply mechanism 80 and an $N_2$ gas supply source 81 is connected to with a line 84a, and the line 84a is provided from the upstream side with a variable throttle valve 82 and an open/close valve 83.

The substrate cleaning apparatus 10 further includes a configuration for supplying treatment fluid to the upper surface of the wafer W retained by the retaining plate 30. In the illustrated embodiment, the substrate cleaning apparatus 10 has a chemical liquid supply nozzle 91 for ejecting chemical liquid to the upper surface of the wafer W; a two-fluid nozzle 92 for Jetting a mist of a fluid mixture including DIW and $N_2$ gas to the upper surface of the wafer W. The chemical liquid supply nozzle 91 and the two-fluid nozzle 92 can be moved by a nozzle driving mechanism 93 from the center of the wafer W to its peripheral edge. In other words, the nozzles can supply the treatment fluid while scanning the upper surface of the wafer W. The nozzle driving mechanism 93 can also move the chemical liquid supply nozzle 91 and the two-fluid nozzle 92 to a standby position (not shown) outside the outer cup 56. The chemical liquid supply source 71a can feed chemical liquid to the chemical liquid supply nozzle 91 at a controlled flow rate through a variable throttle valve 94a and an open/close valve 95a. Similarly, the DIW supply source 71b and the $N_2$ gas supply source 81 can feed DIW and $N_2$ gas to the two-fluid nozzle 92 at controlled flow rates by through variable throttle valves 94b, 94c and open/close valves 95b, 95c. The nozzle driving mechanism 93 may be a type that uses a pivotal arm holding a nozzle(s) at its distal end, or a type that uses an arm guided by a guide rail for translational motion and holding a nozzle(s) at its distal end. Further, a single nozzle driving mechanism (93) may drive both the chemical liquid supply nozzle 91 and the two-fluid nozzle 92, or alternatively, the chemical liquid supply nozzle 91 and the two-fluid nozzle 92 may each have an independent nozzle-driving mechanism.

The substrate cleaning apparatus 10 includes a controller 100 that controls the whole operation of the apparatus. The controller 100 controls operation of all functional components of the substrate cleaning apparatus 10 (e.g., the rotational driving unit 39, the vertical driving unit 50, the open/close valves, the variable throttle valves, the nozzle driving mechanism 93, etc.). The controller 100 can be implemented with hardware such as a general-purpose computer, and a program as software for controlling the computer (apparatus control program, processing recipe, etc.). The software may be stored in a hard-disk drive or other storage medium fixedly provided in the computer, or may be stored in a storage medium removably set in the computer such as a CD-ROM, DVD, flash memory. Such a storage medium is denoted with reference number 106. Upon receipt of instructions from a user interface (not shown), a processor 107 calls up a required processing recipe from the storage medium 106 and executes the recipe. The controller 100 thereby controls and operates the functional components of the substrate cleaning apparatus 10 to perform a predetermined process (treatment). Alternatively, the controller 100 may be a system controller that controls the whole operations of the liquid treatment system shown in FIG. 1.

Next, the manner of ejecting treatment fluids (processing fluids) from the bar-shaped nozzle 50 is described. There are two ejection modes set for the bar-shaped nozzle 60 to eject the treatment fluid.

(First Ejection Mode)

Figure 11:
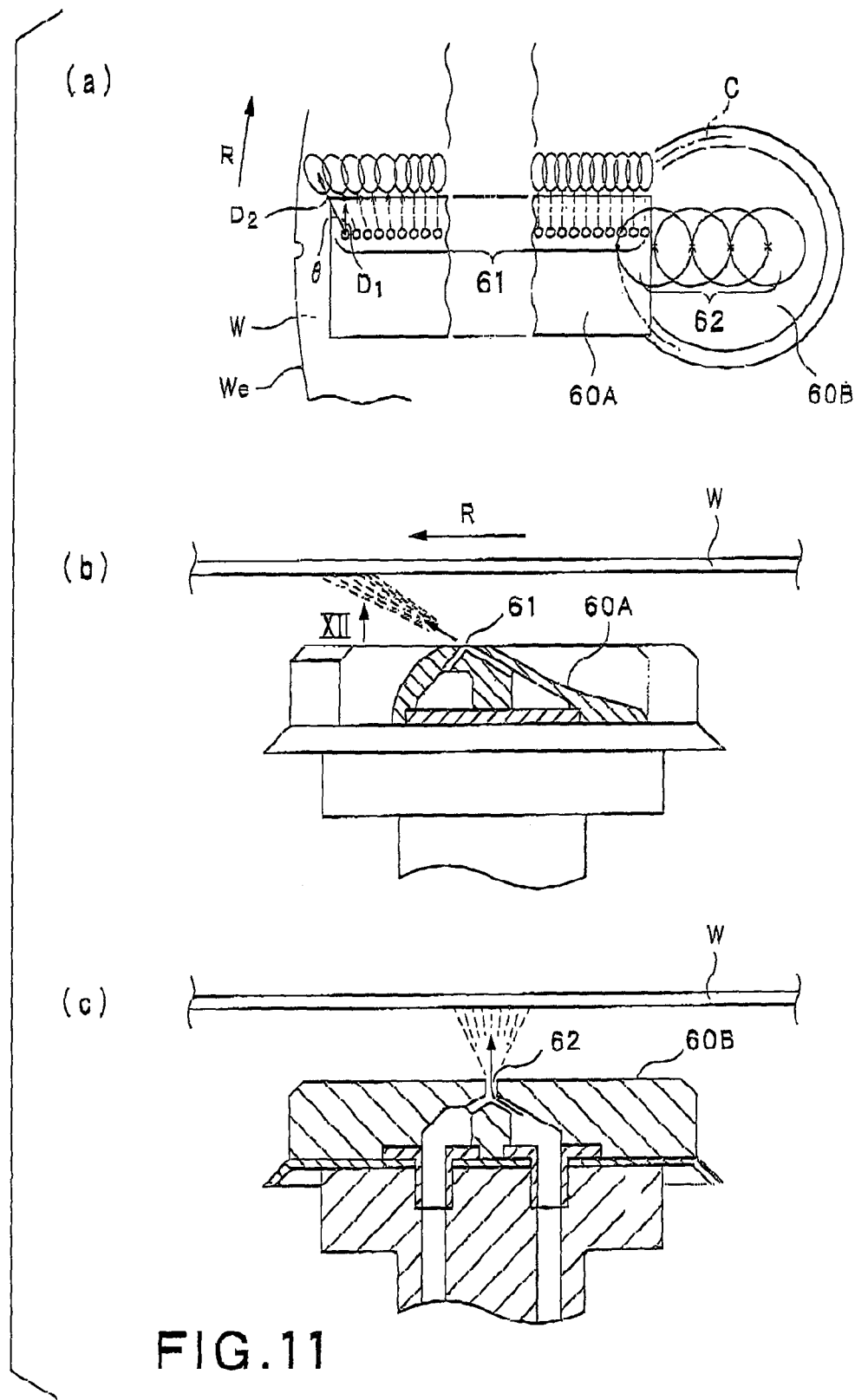
FIG. 11 is for explanation of the status where only a liquid is ejected from the bar-shaped nozzle, wherein (a) is a diagram showing regions wetted with the liquid upon reaching the lower surface of the wafer W, (b) shows a side view showing the manner of liquid ejection from an ejecting port of a bar-shaped portion of the bar-shaped nozzle, and (c) is a side view showing the manner of liquid injection from an ejection port of a central portion of the bar-shaped nozzle.

In a first ejection mode, a chemical liquid such as DHF is fed to the liquid supply passage 40a of the treatment fluid supply pipe 40 while no gas is fed to the gas supply passage 40b. As shown in FIG. 11(b), the chemical liquid is fed to the bar-shaped portion 60A through the liquid passageway 66a and the liquid ejecting passage 62a, and then ejected toward the lower surface of the wafer W from the ejection ports 61. The liquid-ejecting passage 57a is inclined to the rotating direction of the wafer W, and the ejection port 61 is formed so as not to change the direction of liquid flow in the liquid ejecting passage 67a. Therefore, the chemical liquid is ejected obliquely from the ejection port 61. The vector representing the ejecting direction of the chemical liquid has a component of the rotating direction of the wafer W. By ejecting the chemical liquid to the wafer W in such a manner, bouncing (splash-back) of the chemical liquid upon collision against the lower surface of the wafer W can be suppressed. This reduces waste of the treatment liquid and increases efficiency of treatment liquid usage.

Figure 12:
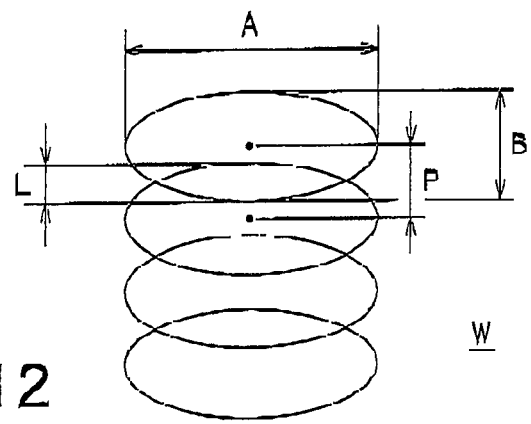
FIG. 12 is a diagram for explanation of spots formed on the wafer by the chemical liquid ejected from ejection ports of the bar-shaped nozzle.

The plurality of ellipses in FIG. 12 each represent an area where an ejected liquid covers on the lower surface of the wafer W at the instant of reaching the surface (this area is hereinafter also referred to as "spot"). After reaching the lower surface of the wafer W, the chemical liquid ejected from the ejection port 61 spreads on the surface due to factors such as a centrifugal force of the rotation of the wafer W, and the pressure of ejecting from the ejection port 61. In a plan view, each ejection port 61 in the bar-shaped portion 60A ejects the liquid in a tangential direction of a circle that passes through the particular ejection port 61 and has its center at the wafer center. Thus, a pitch P between the centers of the elliptical spots is equal to the arrangement pitch of the ejection ports 61. Since the liquid diffuses after being ejected, a minor axis of each ellipse has a length "B" that is greater than a diameter of the ejection port 61. A major axis of the ellipse has a length "A" much greater than the diameter of the ejection port 61 because the liquid is ejected from the ejection port 61 at an angle inclined to the direction of the wafer rotation. Adjacent elliptical spots form an overlapped area with a certain length L.

The ejection port 62 of the central portion 60B in the first ejection mode is configured to turn the flow of the chemical liquid from the liquid ejecting passage 67a into a vertically upward direction. The chemical liquid is ejected vertically upward from the ejection port 62. The chemical liquid thus forms a circular spot on the lower surface of the wafer W. The reason for ejecting the chemical liquid vertically upward is that the part of the wafer W above the central portion 50B has a low circumferential velocity and it is thus not so advantageous to eject the chemical liquid obliquely. Additionally, oblique ejecting of the chemical liquid may rather reduce uniformity of the treatment near the wafer center.

FIG. 11(a) shows the spots formed by the chemical liquid ejected from the ejection ports 61, 62 onto the lower surface of the wafer W at the instant of reaching the lower surface. The small white circles denote the ejection ports 61, "x" marks denote the centers of the ejection ports 62, the white ellipses denote the spots formed by the chemical liquid ejected from the ejection ports 61, and the larger white circles denote the spots formed by the liquid ejected from the ejection ports 62.

At least some (in the illustrated embodiment, five) of the ejection ports 61 positioning at the distal end portion on the bar-shaped portion 60A are oriented in a direction shifted radially outward (see arrow D2) from the tangential direction (arrow D1) at an angle θ, in a plan view. These distal ejection ports 61 form flows of chemical liquid flowing towards outside of the wafer W, whereby unnecessary substances and contaminants having been removed from the lower surface of the wafer W are flushed out of the wafer W. As an example of such configuration, the most distal ejection port 61 may have the maximum angle, and an angle θ of the ejection ports 61 may decrease as it approaches the proximal end. An ejection port 61 at a certain position counted from the outermost port 61, in this case the sixth one, can be adapted to have an angle θ of 0 degrees. If the angles θ are not zero, the overlapping length L between the adjacent elliptical spots are smaller.

Depending on the kind of treatment, the overlapping length (radial length) L between the adjacent elliptical spots may possibly affect in-plane uniformity of the surface being treated. In a case where such problem is expected, it is preferable to change the ejecting pressure (force) of the chemical liquid from the ejection port 61 by adjusting the variable throttle valve 72a. If the ejecting pressure (force) of the chemical liquid is sufficiently high, the liquid spreads out in a burst immediately after reaching the lower surface of the wafer W (at the instant of liquid reaching the surface, the size of spots is not different so much depending on the ejecting pressure). The size of elliptical spots thus substantially increases, thereby to produce the same effect as that obtained by increasing the overlapping length L. The ejecting (discharging) pressure of the liquid can be changed in a pulse-like manner as by alternating high and low pressure, or may be changed continuously in accordance with a predetermined control curve such as a sine curve.

Alternatively or in addition to the above, the chemical liquid may be ejected from the ejection port 61 while moving the bar-shaped nozzle 60. The bar-shaped nozzle 50 may be moved by using a horizontal moving mechanism 54 mounted at the bottom of the vertical driving unit 50 (schematically depicted with a dashed line in FIG. 9). A function similar or equivalent to that of the horizontal moving mechanism 54 can be incorporated in the connecting member 52 as an alternative method. The horizontal moving mechanism 54 slightly shifts the treatment fluid supply pipe 40 in the horizontal direction to move the bar-shaped nozzle 60 in the longitudinal direction of the bar-shaped portion 60A. As the position of the overlapped areas between the adjacent elliptical spots changes, uniformity of the treatment can be improved. The moving distance of the bar-shaped nozzle 60 may be the same as or less than the arrangement pitch of the ejection ports 61 on the bar-shaped nozzle 60. The horizontal moving mechanism 54 can be constructed with a ball screw driven by an electric motor for example. Any other mechanism can be adopted as long as it is suitable of linear driving for a slight amount.

Referring to FIG. 11(a), as can be seen from arc C depicted with dashed lines, the spot formed by the chemical liquid that has been ejected from the ejection port 62 closest to the bar-shaped portion 60A, and the spot formed by the chemical liquid that has been ejected from the ejection port 61 closest to the central portion 60B, form an overlapped area. The length of this overlapped area can also be changed by controlling the ejecting pressure of the chemical liquid.

Figure 16:
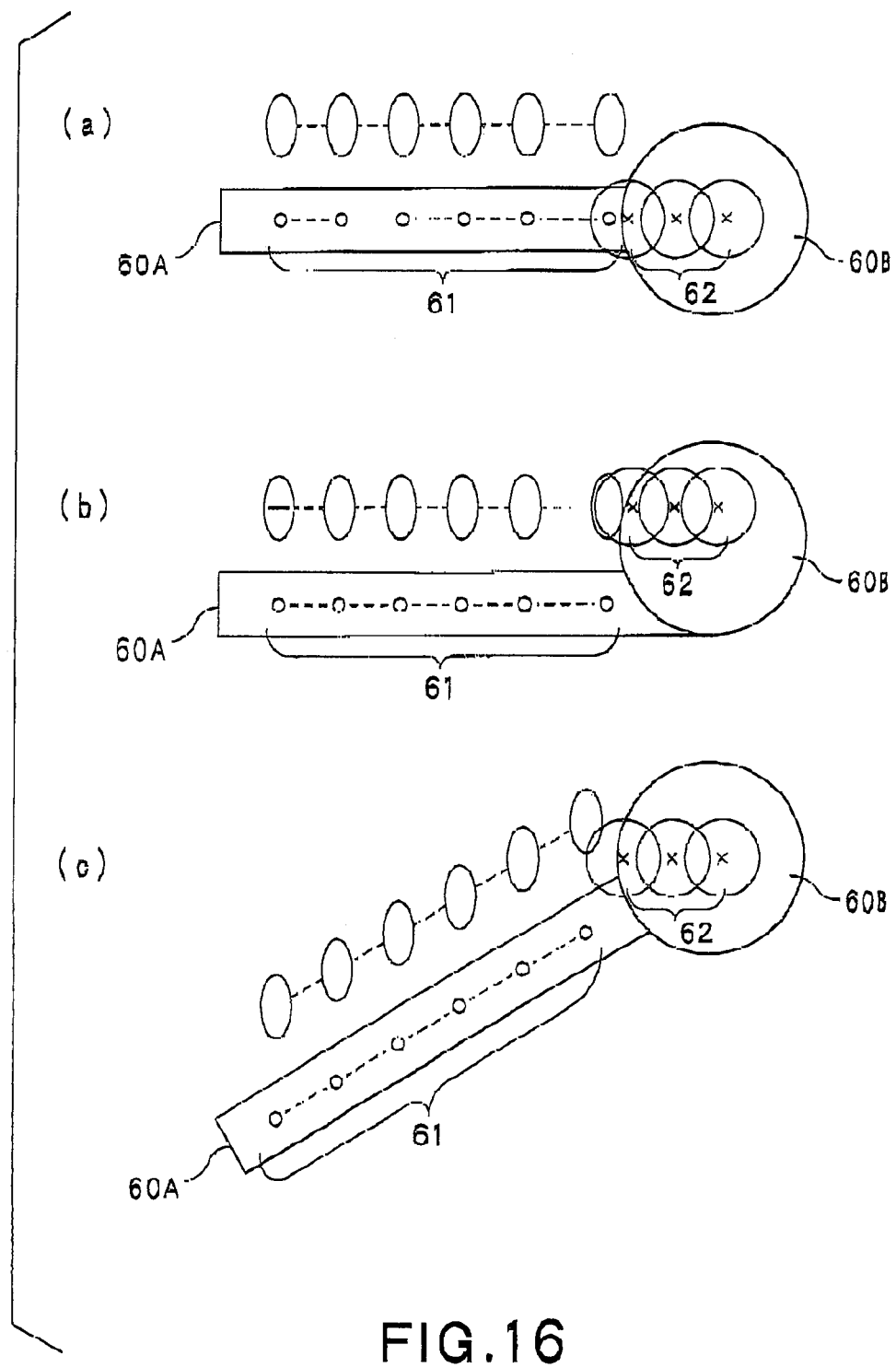
FIG. 16 shows schematic plan views showing modifications of arrangement of ejection ports in the bar-shaped nozzle.

The ejection ports 61 do not need to be strictly arranged on a radius of the wafer (i.e., on a straight line passing through the center of the wafer) as long as the spots formed by the chemical liquid ejected from the ejection ports 61 are generally aligned in a radial direction of the wafer. In the configuration shown in FIG. 11(a), only the ejection ports 62 are exactly positioned in the radial direction of the wafer (i.e., on the straight line passing through the center of the wafer); while the ejection ports 61 are arranged on a straight line parallel to and slightly shifted from the line passing the wafer center. Alternatively, all of the ejection ports 61, 52 may be arranged on one straight line in a plan view, for example, on a straight line passing through the wafer center (see FIG. 16(a)). In another embodiment, all spots formed by the chemical liquid ejected from the ejection ports 61, 62 may be arranged on one straight line, for example, on a straight line passing through the wafer center (see FIG. 16(b)). The spots formed by the chemical liquid ejected from the ejection ports 61, 62 may form a broken line (see FIG. 16(c)). The arrangement line on which the ejection ports 61 are arrayed may be curved to some degree. Anyway, it is sufficient if the plurality of ejection ports 61 are arrayed in an area extending from a position opposing the central portion of the wafer W (substrate) to a position opposing the peripheral portion of the wafer.

(Second Ejection Mode)

Figure 13:
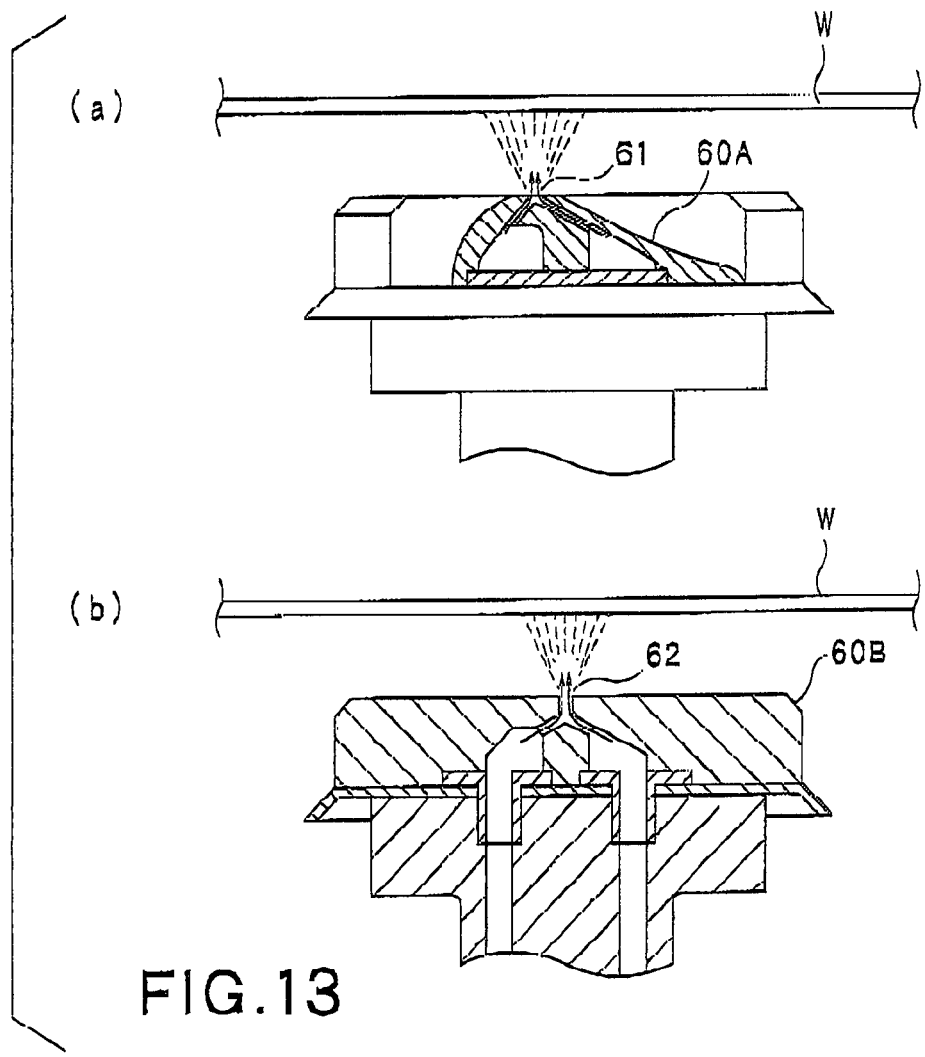
FIG. 13 is for explanation for the status where a two-fluid spray is ejected from the bar shaped nozzle, wherein (a) is a vertical cross sectional view of the bar-shaped portion of the bar-shaped nozzle, and (b) is a vertical cross sectional view of the central portion of the bar-shaped nozzle.

In a second ejection mode, DIW is fed to the liquid supply passage 40a in the treatment fluid supply pipe 40, and $N_2$ gas is fed to the gas supply passage 40b. At the bar-shaped portion 60A, as shown in FIG. 13(a), DIW is guided to each ejection port 61 via the liquid passageway 66a and the liquid ejecting passage 57. Similarly, $N_2$ gas is guided to each ejection port 61 via the gas passageway 66b and the gas ejecting passage 67b. The DIW and the $N_2$ gas collide at the ejection port 61 to form a mist of a fluid mixture including the DIW and the $N_2$ gas, that is, a two-fluid spray. Due to the collision between the DIW and the $N_2$ gas, the two-fluid spray blows upward while spreading in a fan-like fashion. The collision energy of the two-fluid spray cleans the lower surface of the wafer W. In this case, the vector representing the ejecting direction (principal direction) of the two-fluid spray is directed vertically upward. The vector substantially does not have a component of the rotational direction of the wafer W. This is preferable in this mode since the cleaning effect of the two-fluid spray relies on the collision energy or the two-fluid spray. It is also preferable if the vector representing the ejecting direction (principal direction) of the two-fluid spray has a component of the direction opposite to the direction of the wafer W rotation.

In the second ejection mode, since the ejection port 62 of the central portion 60B is formed to turn the flows of the DIW and the $N_2$ gas supplied from the liquid ejecting passage 68a and the gas ejecting passage 68b vertically upward, the two-fluid spray ejected from the ejection port 62 moves upward while spreading in a fan-like fashion.

As with the first ejection mode, the two-fluid spray may be ejected onto upon the lower surface of the wafer W while changing both or one of the DIW ejecting pressure and the $N_2$ gas ejecting pressure by adjusting the opening of the variable throttle valves 72b, 82.

Next, a series of process steps executed by the substrate cleaning apparatus 10 will be described below.

First, the lifting mechanism moves the lift pin plate 20, the treatment fluid supply pipe 40, and the bar-shaped nozzle 60, to their respective raised positions shown in FIG. 2B. Next, as shown by double-dashed lines in FIG. 2B, a wafer W is carried into the cleaning apparatus 10 from outside by the transport arm 104. The wafer W is placed on the lift pins 22 of the lift pin plate 20.

The vertical driving unit 50 next moves the treatment fluid supply pipe 40 and the bar-shaped nozzle 60 from their raised positions to their lowered positions. At this time, since the spring 26 housed in the accommodation member 32 constantly applies a downward force to the connecting member 24, the lift pin plate 20 also moves downward with the treatment fluid supply pipe 40 to the downward movement position. The lower surface of the lift pin plate 20 then pushes the pressure receiving member 31c of the substrate retaining member 31 downward from the state shown in FIG. 6. The substrate retaining member 31 rotates around the axle 31a in the counterclockwise direction in FIG. 6. The substrate retaining portion 31b of the substrate retaining member 31 thus moves towards the wafer W from the lateral side of the wafer (see FIG. 7), and the substrate retaining member 31 thus retains the wafer W from its lateral side (see FIG. 8). At the point of time when the wafer W is just retained from its lateral side by the substrate retaining member 31, the wafer W is lifted to be separated upward from the lift pin 22. Normally, the wafer W is retained by the retaining plate 30 in such a manner that its "front surface" (the surface on which devices are to be formed) comes to the "upper surface" and its "back surface" comes to the "lower surface" (the surface on which no devices are to be formed). In this disclosure, the term "upper surface" (or "lower surface") simply means a face that is facing upward (downward) at a particular point of time.

After the lift pin plate 20, the treatment fluid supply pipe 40, and the bar-shaped nozzle 60 have reached their respective lowered positions shown in FIG. 2A, the nozzle driving mechanism 93 is activated to move the chemical liquid supply nozzle 91 to a position above the center of the upper surface of the wafer W. Next, the rotational driving unit 39 is activated to rotate the retaining plate 30. At this time, since the connecting members 24 extending downward from the lower surface of the lift pin plate 20 is inserted within the accommodation members 32 extending downward from the lower surface of the retaining plate 30, the lift pin plate 20 rotates interlockingly with the rotation of the retaining plate 30, whereby rotating the wafer W as well. The treatment fluid supply pipe 40 and the bar-shaped nozzle 60 connected thereto remain still and does not rotate during the rotation.

Next, the chemical liquid supply nozzle 91 located above the wafer center starts supplying the chemical liquid such as DHF to the upper surface of the wafer W with the wafer W being rotated. While the chemical liquid is supplied to the upper surface of the wafer W, the nozzle driving mechanism 93 moves the chemical liquid supply nozzle 91 radially outward over the wafer W until the nozzle 91 reaches the wafer edge. The upper surface of the wafer W is thus cleaned with the chemical liquid by the so-called scanning method.

Simultaneously with the start of cleaning the upper surface of the wafer W with the chemical liquid, the bar-shaped nozzle 60 supplies a chemical liquid (the same chemical liquid as that supplied to the upper surface of the wafer W) onto the lower surface of the rotating wafer W in the first ejection mode, whereby the lower surface of the wafer W is subjected to chemical cleaning.

After the chemical liquid cleaning, a liquid droplet treatment (process) using a liquid-gas fluid mixture is conducted to remove particles. The two-fluid nozzle 92 is moved to a position above the center of the upper surface of the wafer W by the nozzle driving mechanism 93, and the wafer W starts rotating. The two-fluid nozzle 92 supplies the upper surface with a two-fluid spray which is the fluid mixture of DIW and $N_2$ gas while being moved radially outward to the wafer edge by the nozzle driving mechanism 93. Thus, the liquid droplet treatment of the upper surface of the wafer W is performed in the so-called scanning method.

Simultaneously with the start of the liquid droplet treatment of the upper surface of the wafer W, the bar-shaped nozzle 60 ejects or jets a two-fluid spray which is the fluid mixture of DIW and $N_2$ gas to the lower surface of the rotating wafer W in the second ejection mode. The lower surface of the wafer W is thus also subjected to liquid droplet treatment. Since the liquid droplet treatment provides a strong physical cleaning effect, the chemical liquid used in the preceding treatment and particles can be removed efficiently.

After the liquid droplet treatment, the wafer W is rotated for drying.

When the successive processes are all completed, the vertical driving unit 50 moves the treatment fluid supply pipe 40 and the bar-shaped nozzle 60 from their lowered positions to raised positions. The second interlocking members 46 push the connecting members 24 to raise the lift pin plate 20 from its lowered position to its raised position interlockingly with the raising of the treatment fluid supply pipe 40. At the same time, the biasing force of the spring 26 rotates the substrate retaining member 31 around the axle 31a in the counterclockwise direction in FIG. 6 (i.e., in a direction opposite to the arrow in FIG. 6). The substrate retaining portion 31b leaves from the side of the wafer W and the lower surface of the wafer W is then supported by the lift pins 22.

After the lift pin plate 20, the treatment fluid supply pipe 40, and the bar-shaped nozzle 60 have reached their respective raised positions as shown in FIG. 2B, the wafer W rested on the lift pins 22 is removed from the lift pins 22 by the transport arm 104. The wafer W, after being removed by the transport arm 104, is carried to the outside of the substrate cleaning apparatus 10.

In the foregoing embodiment, due to the use of the nozzle having the plurality of ejection ports 61 arrayed along a line connecting a position opposing the central portion of the wafer W and a position opposing the peripheral portion of the wafer W, the lower surface of the wafer W can be treated with high in-plane uniformity. The amount of consumption of treatment fluid(s) can be reduced. The lower surface of the wafer W can be washed or flushed uniformly. Additionally, the direction in which the liquid is ejected from the ejection ports 61 is inclined in the rotational direction of the wafer W, in other words, the ejection ports 61 are formed such that the direction in which the treatment liquid is ejected has a component of the rotating direction of the wafer W. This suppresses splashing of the treatment liquid upon its collision with the lower surface of the wafer W and reduces waste thereof. Further, generation of particles due to re-adhesion of the splashed liquid can be suppressed. Since the ejection ports in the distal end portion of the nozzle is directed outward, the treatment liquid supplied onto the wafer surface can be flushed out of the wafer surface.

Further, in the Foregoing embodiment, the lower surface of the wafer W can be treated concurrently with the upper surface of the wafer W, with a high in-plane uniformity substantially equivalent to that of the treatment of the upper surface. Thus, throughput can be improved while achieving a treatment result of high quality.

The lift pin plate 20, the treatment fluid supply pipe 40, and the bar-shaped nozzle 60 move vertically relative to the retaining plate 30, and the lift pins 22 for supporting the lower surface of the wafer W are provided on the lift pin plate 20. In addition, the cover 65 is provided between the treatment fluid supply pipe 40 and the bar-shaped nozzle 60 to cover the through-hole 20a in the lift pin plate 20. Since the cover 65 covers the through-hole 20a of the lift pin plate 20, the cleaning liquid is prevented from entering the through-hole 20a for inserting the treatment fluid supply pipe 40. Further, in the foregoing embodiment, the lift pins 22 are provided on the lift pin plate 20. As compared with a conventional apparatus having lift pins to be retracted into through-holes formed in a bottom plate, the apparatus in the foregoing embodiment is advantageous in that there will be less cleaning liquid left on the lift pins 22 after drying a wafer W, which prevents the cleaning liquid from re-adhering to the lower surface of the wafer W after cleaning. This is because the lift pins 22 rotate integrally with the lift pin plate 20. Since the lift pins 22 rotates integrally with the lift pin plate 20, adhesion of droplets of the cleaning liquid onto the lift pins 22 can be suppressed, whereby the re-adhering of the cleaning liquid to the lower surface of the cleaned wafer W can be prevented more effectively.

In the foregoing embodiment, since the treatment fluid supply pipe 40 and the bar-shaped nozzle 50 move vertically together with the lift pin plate 20, the cover 65 covers the through-hole 20a of the lift pin plate 20 also during vertical movement of the treatment fluid supply pipe 40 and the lift pin plate 20, and the cleaning liquid is prevented from entering the through-hole 20a more effectively.

Since the rotary cup 36 is provided on the retaining plate 30, the cleaning liquid is prevented from scattering externally from the rotating wafer W during cleaning. Further, due to the substrate retaining member 31 attached on the retaining plate 30, the wafer W can be stably retained during rotation by supporting the wafer W from its lateral side.

The foregoing description of the embodiment describes a case where the ejection ports 61 inject fluid such as a chemical liquid or DIW while changing the position of the bar-shaped nozzle 60 by the horizontal moving mechanism 54. This case is further describes in detail below referring to FIG. 17.

First, the reason for shifting the lateral position of the bar-shaped nozzle 60 while ejecting the treatment liquids from the ejection ports 61 will be described. It is assumed that a treatment liquid is supplied from the chemical liquid supply source 71a or the DIW supply source 71b to the bar-shaped nozzle 60 at a constant (fixed) pressure. In such a case, as the number of ejection ports 61 increases and/or the hole diameter of the ejection ports 61 increases, the velocity of the treatment liquid ejected from each ejection port 61 decreases. Under the condition that the feed pressures of the chemical liquid supply source 71a and the DIW supply source are fixed, the number of ejection ports 61 and their hole diameter each need to be limited in order to maintain the velocity of the liquid ejected (jetted) from each ejection port 61 at a predetermined desired value. When the number of ejection ports 61 and their hole diameter each are limited as above, two adjacent spots formed on the lower surface of the wafer W by the treatment liquid concurrently ejected from two adjacent ejection ports 61 may not overlap with each other, in a plan view. In such case, it is advantageous to shift the lateral position of the bar-shaped nozzle 60 during the ejection of the treatment liquid from the ejection ports 61.

Figure 17:
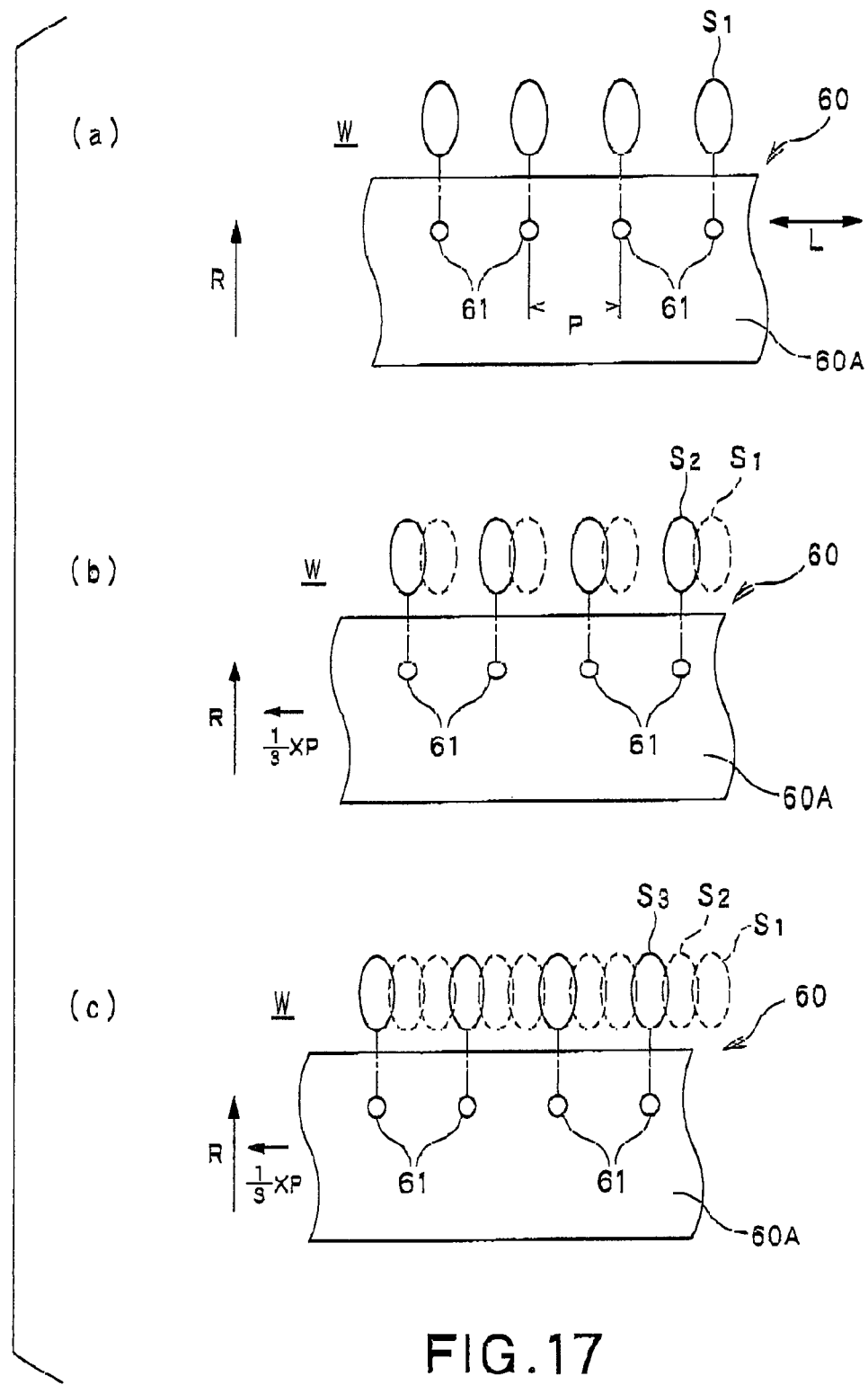
FIG. 17 shows schematic plan views illustrating an example of a way of shifting the bar-shaped nozzle while ejecting a liquid from the ejection ports.

FIG. 17 shows schematic plan views showing states of when the liquid is ejected from the ejection ports 61 while shifting the position of the bar-shaped nozzle 60. As shown in FIG. 17(a), at least some of the plurality of ejection ports 61 are arranged at a predetermined pitch P along the horizontal line on which the plurality of ejection ports 61 lay. The arrow L in FIG. 17(a) denotes a direction in which the horizontal line connecting the arranged ejection ports 61 extends (hereinafter, this direction is referred to as the arrangement direction L), FIG. 17(b) is a schematic plan view that shows a state in which the position of the bar-shaped nozzle 60 is shifted through one third (⅓) of the arrangement pitch P in the arrangement direction L, from the position in FIG. 17(a) towards the peripheral edge of the wafer W. FIG. 17(c) is a schematic plan view that shows a state in which the position of the bar-shaped nozzle 60 is shifted by one third of the arrangement pitch P in the arrangement direction L, from the position in FIG. 17(b) towards the peripheral edge of the wafer W.

First, the ejection ports 61 eject a treatment liquid (processing liquid) to the lower surface of the wafer W in the first ejection mode with the bar-shaped nozzle 60 placed at a predetermined position (first position). FIG. 17(a) shows a spot S1 formed on the lower surface of the wafer W by the treatment liquid ejected from each ejection port 61 at the moment the treatment liquid reaches the lower surface of the wafer W. In FIG. 17(a), the spot S1 is depicted as an elliptical region surrounded by a solid line. The ejection of the treatment liquid from the bar-shaped nozzle 60 in the first position is continued for a time period corresponding to at least one revolution (360 degrees) of the wafer W.

Next, as shown in FIG. 17B, the horizontal moving mechanism 54 shifts the bar-shaped nozzle 60 through one third of the arrangement pitch P, in the arrangement direction L towards the edge of the wafer W. Then at this position (second position), each ejection port 61 ejects treatment liquid to the lower surface of the wafer W in the first ejection mode. In FIG. 17(b), depicted by a solid line is a spot S2, which is formed on the lower surface of the wafer W by the treatment liquid ejected from each ejection port 61 at the moment the treatment liquid reaches the lower surface of the wafer W, when the bar-shaped nozzle 60 is positioned at the second position. In FIG. 17(b), the spot S1 formed when the bar-shaped nozzle 60 is in the first position is depicted by dotted lines. The second position is set such that one spot S1 formed when the bar-shaped nozzle 60 is in the first position and one spot S2 formed when the bar-shaped nozzle 60 is in the second position partially overlap in a plan view. The ejection of the treatment liquid from the bar-shaped nozzle 60 in the second position is continued for a time period corresponding to at least one revolution (360 degrees) of the wafer W.

Next, as shown in FIG. 17(c), the position of the bar-shaped nozzle 60 is further shifted by the horizontal moving mechanism 54 through one third of the arrangement pitch P, towards the edge of the wafer W in the arrangement direction L. Then at this position (third position), the treatment liquid is ejected from each ejection port 61 to the lower surface of the wafer W in the first ejection mode. In FIG. 17(c), depicted by a solid line is a spot S3, which is formed on the lower surface of the wafer W by the treatment liquid ejected from each ejection port 61 at the moment the treatment liquid reaches the lower surface of the wafer W, when the bar-shaped nozzle 60 is positioned at the third position. In FIG. 17(c), the spot S1 and S2 formed when the bar-shaped nozzle 60 is in the first and second positions are depicted by dotted lines. The third position is set such that, in a plan view, one spot S3 partially overlaps with both one spot S1 and one spot S2 that were respectively formed in the first and second positions of the bar-shaped nozzle 60. This allows the lower surface of the wafer W to be fully covered with the treatment liquid without any gaps in the arrangement direction L of the ejection ports 61. The ejection of the treatment liquid from the bar-shaped nozzle 60 in the third position is continued for a time period corresponding to at least one revolution (360 degrees) of the wafer W.

With the embodiment shown in FIG. 17, the treatment liquid can be ejected from each ejection port 61 while changing the position of the bar-shaped nozzle 60 in the arrangement direction L of the ejection ports 61. Accordingly, even if the hole diameter of each ejection port 61 is small relative to the arrangement pitch P and thus the spots S1 formed on the lower surface of the wafer W by the treatment liquid concurrently ejected from any two adjacent ejection ports 61 cannot overlap with each other in a plan view as in FIG. 17(a), the treatment liquid can be supplied onto the lower surface of the wafer W without discontinuity in the arrangement direction L of the ejection ports 61. Even if the treatment liquid supplied from the chemical liquid supply source 71a or the DIW supply source 71b to the bar-shaped nozzle 60 has a fixed pressure, the number of ejection ports 61, the hole diameter of each ejection port 61, and other parameters can be set freely while ensuring the desired jetting (ejecting) velocity of the treatment liquid. In addition, the treatment liquid can be uniformly supplied to the lower surface of the wafer W by shifting the bar-shaped nozzle 60 during ejection. In other words, uniform liquid treatment can be performed to the lower surface of the wafer W.

In the embodiment shown in FIG. 17, the position of the bar-shaped nozzle 60 were shifted through one third of the arrangement pitch P in the arrangement direction L. However, not limited thereto, the position of the bar-shaped nozzle 60 may be shifted through half (½) of the arrangement pitch P in the arrangement direction L, or one fourth (¼) of the arrangement pitch P in the arrangement direction L, or even finer. The amount of the shift of the bar-shaped nozzle 60 per one shifting operation may be set to an appropriate value in view of the arrangement pitch P of the ejection ports 61 and the size of the spots S formed on the wafer W by the treatment liquid ejected from the ejection ports 61.

In the embodiment shown in FIG. 17, the bar-shaped nozzle 60 was intermittently moved from the first position, to the second position, and to the third position. Alternatively, the treatment liquid may be ejected from the ejection ports 61 while continuously moving the bar-shaped nozzle 50 through a predetermined distance shorter than the arrangement pitch P in the arrangement direction L. Uniform liquid treatment can also be performed to the lower surface of the wafer W in this way. The moving speed of the bar-shaped nozzle may be set to an appropriate value which enables the treatment liquid to be continuously supplied onto the lower surface of the wafer W without discontinuity in the arrangement direction L of the ejection ports 61, in view of the size of the spots S and the rotating speed of the wafer W.

In the embodiment shown in FIG. 17, the bar-shaped nozzle 60 moves towards the edge of the wafer W in the arrangement direction L. Alternatively, the bar-shaped nozzle 60 may be moved towards the center of the wafer W in the arrangement direction L. Further, the bar-shaped nozzle 60 may reciprocate in the arrangement direction L.

Such moving of the bar-shaped nozzle 60 may be implemented in any ways by the horizontal moving mechanism 54. For example, the controller 100 may control the horizontal moving mechanism 54 to implement the above moving of the bar-shaped nozzle 60. In this case, a program for moving the bar-shaped nozzle 60 in a predefined sequence is stored within the storage medium 106 of the controller 100.

In one embodiment, all the plurality of ejection ports 61, rather than some of them, may be arranged in the arrangement direction L at an equal arrangement pitch P (i.e., regular intervals). The ejection ports 61 arranged at the equal pitch P as such may be formed even in a region allowing the treatment liquid to be ejected onto the central portion of the wafer W. Alternatively, the ejection ports 62 shown in FIGS. 10 (a), (c) may be formed in a region allowing the treatment liquid to be ejected onto the central portion of the wafer W, and the arrangement pitch of the ejection port 62 may be equal to the arrangement pitch P of the ejection ports 61. Such configuration also enables the treatment liquid to be supplied uniformly to the entire lower surface of the wafer W.

The foregoing embodiments may be modified as follows.

Figure 14:
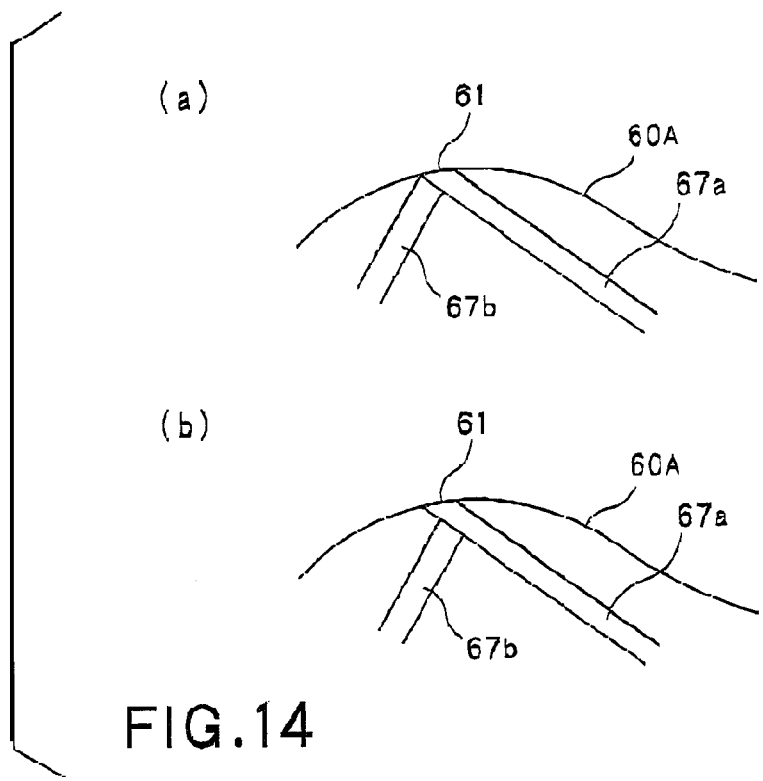
FIG. 14 shows diagrams showing variations of the manner in which a liquid-ejecting passage and a gas-ejecting passage meet near the ejection port of the bar-shaped portion of the bar-shaped nozzle.

In the forgoing embodiment, as shown in FIG. 14(a), the liquid-ejecting passage 67a and the gas-ejecting passage 67b crossed exactly at the opening of the ejection port 61 in the bar-shaped portion 60A. However, as shown in FIG. 14(b), the gas-ejecting passage 67b may meet the liquid-ejecting passage 67a at a position slightly short of the opening.

In the foregoing embodiment, the DHF cleaning (chemical liquid treatment), the DIW rinsing, the liquid droplet treatment with DIW and $N_2$ gas, the DIW rinsing, and the spin drying are performed in that order. However, the processes (treatments) performed by the substrate processing apparatus in the foregoing embodiment is not limited to them. For example, chemical liquid treatment (with DHF or any other appropriate chemical liquid), DIW rinsing, and spin drying may be sequentially performed. In this case, DIW rinsing may be performed by ejecting only DIW without ejecting $N_2$ gas. The chemical liquid treatment may be a treatment that ejects a chemical liquid and $N_2$ gas at the same time, in other words, a so-called two-fluid chemical treatment that jets a fluid mixture of the chemical liquid and $N_2$ gas towards the wafer W. The gas is not limited to $N_2$ gas and may be any other appropriate inert gas. Further alternatively, a reactive gas may be used depending on the kind of liquid treatment.

The treatments performed by the substrate processing apparatus in the foregoing embodiment may be various kinds of liquid treatments performed to the back surface of a wafer in coating/developing processes: For example, the treatment may be a cleaning process after development or a removing process for an unnecessary resist film. Alternatively, the treatment may be a process to the lower surface (e.g., back surface) of the wafer to be performed as a pre-plating or post-plating process.

Figure 15:
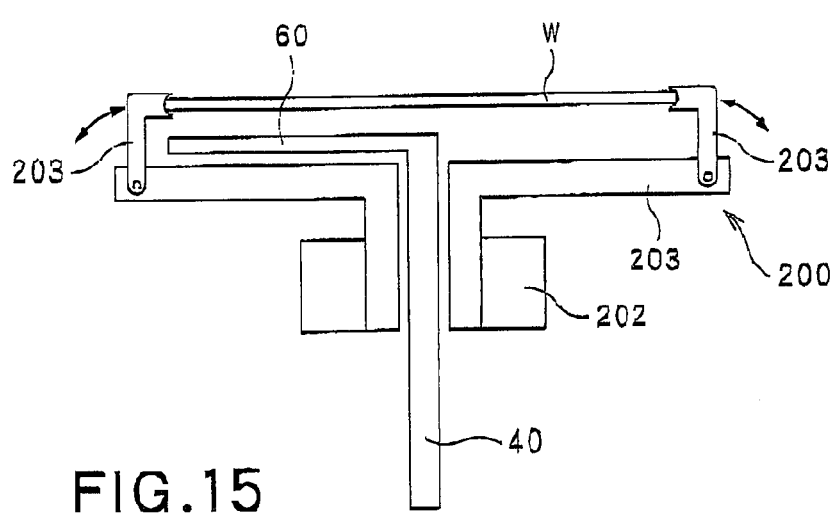
FIG. 15 is a schematic diagram for explaining a possible modification of the liquid treatment apparatus.

In the foregoing embodiment, as the substrate retaining unit of a so-called spin chuck for retaining and rotating the wafer, an assembly comprising the lift pin plate 20 and the retaining plate integrated with the rotary cup 36 is used. However, the bar-shaped nozzle 60 in the foregoing, embodiment may be combined with any of various types of spin chucks to construct a liquid treatment apparatus, as long as the spin chuck holds the peripheral edge of a wafer. For example, as shown schematically in FIG. 15, a mechanical spin chuck 200 configured to hold the peripheral edge of a wafer may be combined with the treatment fluid supply pipe 40 and the bar-shaped nozzle 60 employed in the present embodiment. The mechanical spin chuck 200 includes a rotating member 201, a plurality of (three or four) wafer retaining members 203 mounted to the rotating member 201, and a motor 202 for rotating the rotating member 201. The liquid treatment apparatus shown in FIG. 15 may be of a type configured to exclusively treat only the lower surface of the wafer W, unlike the foregoing embodiment. In this case, a nozzle for supplying the treatment fluid to the upper surface is not necessary. Various constituent elements can be added to the configuration shown in FIG. 15 (e.g., a cup for receiving splashes of the treatment fluid, a nozzle for treating the upper surface, etc.). Incidentally, in an apparatus employing a spin chuck as shown in FIG. 15, the distal end of the bar-shaped nozzle 60 can be extended radially outward as far as possible, as long as it does not interfere with the wafer retaining member 203.

Figure 18:
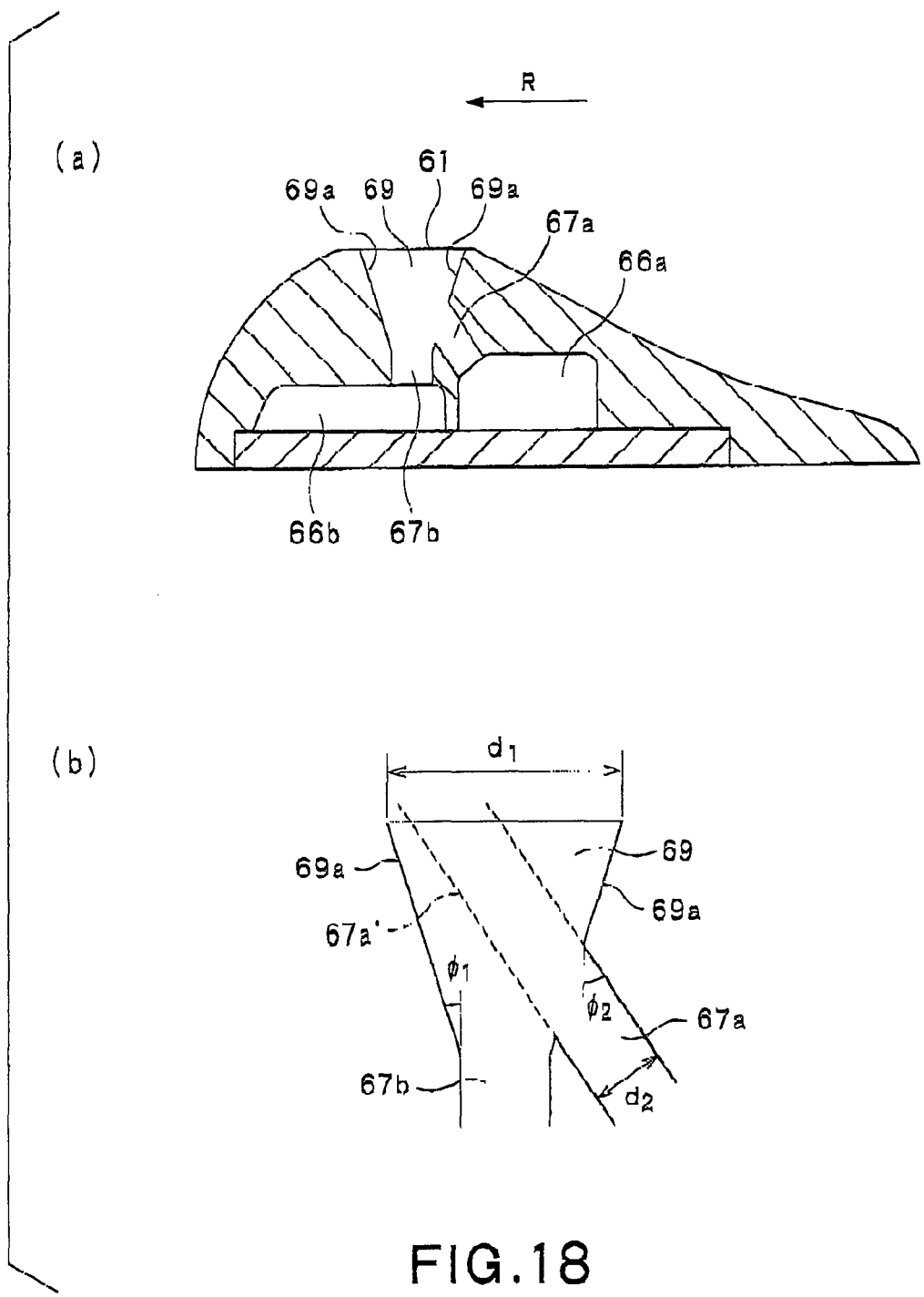
FIG. 18 shows a vertical cross sectional view and a schematic diagram showing the configuration around the ejection port in a modified bar-shaped nozzle.

In the foregoing embodiment, in the second mode, DIW guided through the liquid-ejecting passage 67a and $N_2$ gas guided through the gas-ejecting passage 67b collide with each other at the ejection port 61 of the bar-shaped nozzle 60, whereby the DIW and the $N_2$ gas form a mist-like fluid mixture (two-fluid spray). In order to form such a two-fluid spray, the bar-shaped nozzle 60 may be provided, in the inside thereof, with a mixing section 69 in which the DIW and the $N_2$ gas collide with each other, as shown in FIG. 18(a). The mixing section 69 is a space expanding as approaching the ejection port 61. More specifically, the mixing section 69 is a truncated conical space with its base (the face of a larger area) serving as the ejection port 61, and its top face (the face of a smaller area) being positioned inside the bar-shaped nozzle 60. The mixing section 69 provided inside the bar-shaped nozzle 60 shapes the two-fluid spray into a desirable shape, e.g., a shape of the two-fluid spray spreading more isotropically. The lower surface of the wafer W can then be cleaned more uniformly.

The gas-ejecting passage 67b that guides the $N_2$ gas may be configured to extend upward in the vertical direction as shown in FIG. 18(a). The two-fluid spray will thus be jetted in the vertical direction which in turn renders the two-fluid spray to collide with the lower surface of the wafer W in the vertical direction. Therefore, the two-fluid spray can be collided with the lower surface of the wafer W without reducing its energy. This allows the lower surface of the wafer W to be cleaned efficiently.

In the embodiment of FIG. 18(a), the mixing section 69 and the liquid-ejecting passage 67a are constructed in a manner that, in the first ejection mode, a sidewall 69a defining the mixing section 69 does not deflect liquid ejected from the ejection port 61 via the liquid-ejecting passage 67a. More specifically, as shown in FIG. 18(b), geometry parameters (e.g., angles φ1 and φ2, which are the angles with respect to the vertical direction of the sidewall 69a and the liquid-ejecting passage 67a; the hole diameters d1 and d2 of the ejection port 61 and the liquid-ejecting passage 67a; and the position of connection between the sidewall 69a and the liquid-ejecting passage 67a) are determined such that a imaginarily extension of the liquid-ejecting passage 67a towards the ejection port 61, that is, a space 67a' does not contact the sidewalls 69a. The liquid guided through the liquid-ejecting passage 67a is thus ejected obliquely from the ejection port 61 at the angle φ2. The angle φ2 is preferably set so that the vector representing the direction in which the treatment liquid is ejected from the ejection port 61 has a component of the rotating direction R of the wafer W.

In the foregoing embodiment, the liquid treatment apparatus is configured such that the bar-shaped nozzle 50 can operate in two modes, one being the first ejection mode for ejecting only a liquid, the other being the second ejection mode for ejecting a two-fluid spray comprising a mixed fluid of a liquid and a gas. However, if the ejection of the two-fluid spray is not necessary, all the structural elements for ejecting $N_2$ gas (e.g., the gas supply passage 40b, the gas passageway 66b, the gas ejecting passage 67b, 68b, the gas supply mechanism 80, etc.) may be removed from the liquid treatment apparatus in the foregoing embodiment.

The invention claimed is:

1. A liquid treatment apparatus comprising:
a substrate retaining unit comprising a retaining member, configured to hold a peripheral edge of a substrate to retain the substrate horizontally;
a lift pin plate provided thereon with lift pins, the lift pins being arrayed on an imaginary circle extending along and adjacent to a periphery of the lift pin plate, wherein a through-hole is formed in a central portion of the lift pin plate;
a rotational driving unit configured to rotate the substrate retaining unit together with the lift pin plate;
a first nozzle disposed below a lower surface of the substrate retained by the substrate retaining unit to eject a treatment liquid towards the lower surface of the substrate, the first nozzle comprising a central member opposing a central portion of the substrate and a bar-shaped portion extending from the central member radially outwardly and terminating before the imaginary circle to avoid interference of the bar-shaped portions with the lift pins, wherein the bar-shaped portion has a plurality of first ejection ports arrayed from a position opposing a central portion of the substrate to a position opposing a peripheral portion of the substrate retained by the substrate retaining unit, and the central member is positioned above the through-hole; and
a vertical driving unit configured to vertically move the lift pin plate together with the first nozzle relative to the substrate retaining unit so as to lift the substrate released from the substrate retaining unit by means of the lift pins;
a liquid supply mechanism that supplies a treatment liquid to the first ejection ports, wherein each of the first ejection ports is configured to eject the treatment liquid towards the lower surface of the substrate in an ejecting direction which is inclined towards a rotation direction of the substrate rotated by the rotational driving unit.

2. The liquid treatment apparatus according to claim 1, wherein:
the first ejection ports are arrayed along a straight line extending from the position opposing the central portion of the substrate retained by the substrate retaining unit to the position opposing the peripheral portion of the substrate retained by the substrate retaining unit, and the straight line extends in a radial direction of the substrate held by the substrate retaining unit or extends parallel to the radial direction.

3. The liquid treatment apparatus according to claim 1, wherein:
the first nozzle comprises at least one second ejection port provided in the central member, in an area radially inside an area in which the first ejection ports are provided, and the second ejection port is configured to eject a treatment liquid vertically upward.

4. The liquid treatment apparatus according to claim 1, wherein:
at least a radially outermost one of the plurality of the first ejection ports is configured to eject a treatment liquid in an ejecting direction having a radially outward component.

5. The liquid treatment apparatus according to claim 1, wherein:
an area covered by a treatment liquid at a moment when the treatment liquid ejected from an ejection port of the first nozzle reaches the lower surface of the substrate retained by the substrate retaining unit is referred to as a "spot", and
adjacent ones of the first ejection ports are configured to form adjacent spots which overlap each other.

6. The liquid treatment apparatus according to claim 1, wherein:
the first nozzle comprises at least one second ejection port provided in the central member, in an area radially inside an area in which the first ejection ports are provided, and the second ejection port is configured to discharge a treatment liquid vertically upward, an area covered by a treatment liquid at a moment when the treatment liquid discharged from an ejection port of the first nozzle reaches the lower surface of the substrate retained by the substrate retaining unit is referred to as a "spot", and
a radially innermost one of the plurality of first ejection ports is configured to form a spot which overlaps with a spot formed by a treatment liquid ejected from the second ejection port.

7. The liquid treatment apparatus according to claim 1, further comprising a second nozzle configured to supply a treatment liquid onto an upper surface of the substrate retained by the substrate retaining unit.

8. The liquid treatment apparatus according to claim 1, wherein:
the liquid supply mechanism comprises a variable throttle, and wherein said liquid treatment apparatus further comprises a controller configured to vary an opening of the variable throttle according to a predetermined sequence, when the treatment liquid is being supplied from the first ejection ports onto the lower surface of the substrate.

9. The liquid treatment apparatus according to claim 1, wherein:
the central member comprises at least one second ejection port configured to eject a treatment liquid vertically upward;
a treatment liquid supply pipe penetrates through the through-hole; and
the first ejection ports and the at least one second ejection port are arrayed on a straight line, in a plan view.

10. The liquid treatment apparatus according to claim 1, wherein:
the central member comprises at least one second ejection port configured to eject a treatment liquid vertically upward;
a treatment liquid supply pipe penetrates through the through-hole;
an area covered by a treatment liquid at a moment when the treatment liquid ejected from an ejection port of the first nozzle reaches the lower surface of the substrate retained by the substrate retaining unit is referred to as a "spot", and
the first ejection ports and the at least one second ejection port are configured to form spots arrayed along a straight line, in a plan view.

11. The liquid treatment apparatus according to claim 1, wherein:
the central member comprises at least one second ejection port configured to eject a treatment liquid vertically upward;
a treatment liquid supply pipe penetrates through the through-hole;
an area covered by a treatment liquid at a moment when the treatment liquid ejected from an ejection port of the first nozzle reaches the lower surface of the substrate held by the substrate retaining unit is referred to as a "spot", and
the first ejection ports and the at least one second ejection port are configured to form spots arranged on a polygonal line, in a plan view.

12. The liquid treatment apparatus according to claim 1, wherein:
the first ejection ports are arrayed along a straight line extending from the position opposing the central portion of the substrate retained by the substrate retaining unit to the position opposing the peripheral portion of the substrate retained by the substrate retaining unit;
said liquid treatment apparatus further comprises:
a horizontal moving mechanism configured to move the first nozzle along the straight line along which the first ejection ports are arrayed; and
a controller configured to control the horizontal moving mechanism to move the first nozzle according to a predetermined sequence, when the first ejection ports eject a treatment liquid towards the lower surface of the substrate.

13. The liquid treatment apparatus according to claim 12, wherein:
at least some of the plurality of first ejection ports are arrayed along the straight line at regular intervals; and
the controller is configured to control the horizontal moving mechanism to move the first nozzle at a distance less than the interval between adjacent two of said at least some first ejection ports.

14. The liquid treatment apparatus according to claim 1, wherein:
a treatment liquid supply pipe connected to the central member penetrates through the through-hole to supply the treatment liquid to the first nozzle;
an annular vertical protrusion surrounding an upper end of the through-hole rises from an upper surface of the lift pin plate to prevent the treatment liquid existing on the upper surface of the lift pin plate from flowing into the through-hole; and
a cover is provided around the central member to cover the through-hole from above to prevent the treatment liquid from falling into the through-hole.

* * * * *